(12) United States Patent
Howald et al.

(10) Patent No.: US 10,832,979 B2
(45) Date of Patent: Nov. 10, 2020

(54) FEEDBACK CONTROL SYSTEM FOR ITERATIVE ETCH PROCESS

(71) Applicant: Lam Research Corporation, Fremont, CA (US)

(72) Inventors: Arthur M. Howald, Livermore, CA (US); John Valcore, Jr., Fremont, CA (US); Henry Stephen Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 96 days.

(21) Appl. No.: 15/902,861

(22) Filed: Feb. 22, 2018

(65) Prior Publication Data

US 2019/0259674 A1 Aug. 22, 2019

(51) Int. Cl.

| H01L 21/66 | (2006.01) |
|---|---|
| G01B 11/06 | (2006.01) |
| H01L 21/311 | (2006.01) |
| H01J 37/32 | (2006.01) |
| H01L 21/67 | (2006.01) |
| H01L 21/3213 | (2006.01) |
| H01L 21/3065 | (2006.01) |

(52) U.S. Cl.
CPC .......... *H01L 22/26* (2013.01); *G01B 11/0616* (2013.01); *H01J 37/32* (2013.01); *H01J 37/32917* (2013.01); *H01L 21/3065* (2013.01); *H01L 21/31116* (2013.01); *H01L 21/31138* (2013.01); *H01L 21/32136* (2013.01); *H01L 21/67069* (2013.01); *H01L 21/67253* (2013.01); *H01L 22/20* (2013.01)

(58) Field of Classification Search
None
See application file for complete search history.

(56) References Cited

U.S. PATENT DOCUMENTS

| 2015/0348854 A1* | 12/2015 | Kapoor | H01J 37/32935 438/10 |
|---|---|---|---|
| 2017/0076916 A1* | 3/2017 | Sato | H01J 37/32183 |
| 2019/0237337 A1* | 8/2019 | Matsui | G01B 11/065 |

OTHER PUBLICATIONS

D. Metzler et al. "Fluorocarbon assisted atomic layer etching of SiO2 and Si using cyclic Ar/C4F8 and Ar/CHF3 plasma", J. Vac. Sci . Technol. A, vol. 34, pp. 01B101-1 to 01B101-10. (Year: 2016).*

* cited by examiner

*Primary Examiner* — Jiong-Ping Lu
(74) *Attorney, Agent, or Firm* — Penilla IP, APC

(57) ABSTRACT

An iterative etch process includes a plurality of cycles performed in a successive manner on a substrate. Each cycle of the plurality of cycles includes a deposition phase and an activation phase. The deposition phase is performed before the activation phase in each cycle. The deposition phase is defined as a plasma-based process to enable removal of a particular material from a surface of the substrate. The activation phase is defined as a plasma-based process to remove the particular material from the surface of the substrate. One or more feedback control signals are acquired during the iterative etch process, correlated to a condition of the substrate, and analyzed to determine the condition of the substrate. One or more process parameters of the iterative etch process is/are adjusted based on the condition of the substrate as determined by analyzing the one or more feedback control signals.

30 Claims, 11 Drawing Sheets

FEEDBACK CONTROL SYSTEM FOR ITERATIVE ETCH PROCESS

BACKGROUND

1. Field of the Invention

The present disclosure relates to semiconductor device fabrication.

2. Description of the Related Art

In various semiconductor fabrication processes, a process gas is transformed into a plasma within a processing chamber in which a substrate is positioned. The substrate is exposed to the plasma to produce a desired effect on the substrate, such as to etch/remove material from the substrate, and/or deposit material on the substrate, and/or modify a characteristic of a material on the substrate. Various process parameters are preset to perform such plasma-based fabrication processes. For example, preset process parameters can specify how the process gas is composed and delivered to the processing chamber, how the process gas is transformed into the plasma within the processing chamber, and how long the substrate is exposed to the plasma. In some plasma-based fabrication processes, however, the effects on the substrate vary as processing proceeds even though the preset process parameters remain unchanged. Such variation in processing effects on the substrate can be attributed to changing conditions on the substrate, within the plasma and/or within the processing chamber. Some semiconductor fabrication situations require careful control of how the substrate is affected over the course of a given fabrication process. It is within this context that the present disclosure arises.

SUMMARY

In an example embodiment, a method is disclosed for processing a substrate. The method includes performing an iterative etch process on the substrate. The iterative etch process includes a plurality of cycles performed in a successive manner. Each cycle of the plurality of cycles includes a deposition phase and an activation phase. The deposition phase is performed before the activation phase in each cycle. The deposition phase is defined as a plasma-based process to enable removal of a particular material from a surface of the substrate. The activation phase is defined as a plasma-based process to remove the particular material from the surface of the substrate. The method also includes acquiring one or more feedback control signals during performance of the iterative etch process on the substrate. The one or more feedback control signals are correlated to a condition of the substrate. The method also includes analyzing the one or more feedback control signals to determine the condition of the substrate. The method also includes adjusting one or more process parameters of the iterative etch process based on the condition of the substrate as determined by analyzing the one or more feedback control signals.

In an example embodiment, a control module for controlling processing of a substrate is disclosed. The control module includes a processor and a memory configured to execute program instructions to direct performance of an iterative etch process on a substrate. The iterative etch process includes a plurality of cycles performed in a successive manner. Each cycle of the plurality of cycles includes a deposition phase and an activation phase. The deposition phase is performed before the activation phase in each cycle. The deposition phase is defined as a plasma-based process to enable removal of a particular material from a surface of the substrate. The activation phase is defined as a plasma-based process to remove the particular material from the surface of the substrate. The control module also includes data acquisition hardware and software configured to acquire one or more feedback control signals during performance of the iterative etch process on the substrate. The one or more feedback control signals are correlated to a condition of the substrate. The control module also includes logic executable by the processor in conjunction with the memory to analyze the one or more feedback control signals to determine the condition of the substrate. The control module also includes logic executable by the processor in conjunction with the memory to adjust one or more process parameters of the iterative etch process based on the condition of the substrate as determined by analyzing the one or more feedback control signals.

Other aspects and advantages of the invention will become more apparent from the following detailed description, taken in conjunction with the accompanying drawings, illustrating by way of example the present invention.

DETAILED DESCRIPTION

Figure 1A:
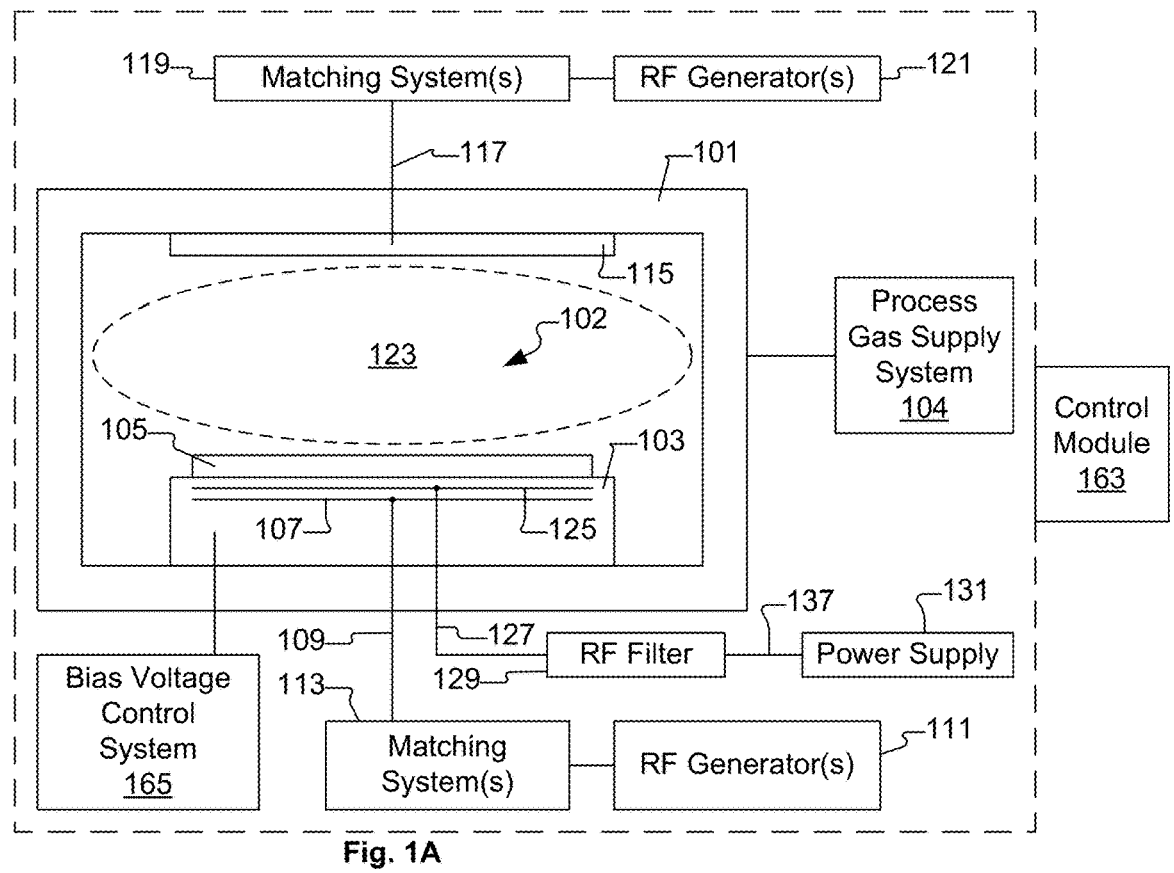
FIG. 1A shows an example vertical cross-section diagram of a CCP processing chamber, in accordance with some embodiments of the present disclosure.

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

In the semiconductor industry, semiconductor substrates can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the substrate is exposed. Reactive species and/or charged species within the plasma interact with the substrate to modify a condition of the substrate, such as by modifying a material present on the substrate, or by depositing material on the substrate, or by removing/etching material from the substrate, by way of example. The CCP and ICP processing chambers can be equipped with one or more electrodes that receive RF power for generating the plasma within the plasma processing region. Also, the CCP and ICP processing chambers can be equipped with one or more electrodes that receive RF power and/or direct current (DC) power to generate a bias voltage at the substrate location for attracting charged species from the plasma toward the substrate. Also, in some embodiments, the CCP and ICP processing chambers can be equipped with one or more electrically powered components, such as a heater assembly, that receive electrical power from one or more power supplies, where each of the one or more power supplies is either a DC power supply or an AC (alternating current) power supply.

In some embodiments, RF signals and/or electrical (non-RF) signals present on RF and/or non-RF electrical transmission paths connected to the CCP and/or ICP processing chambers can provide an indication of the condition of the substrate and/or of the plasma within the plasma processing region, which can in turn indicate the condition of the substrate. In various embodiments, the RF signals and/or electrical (non-RF) signals present on RF and/or non-RF electrical transmission paths connected to the CCP and/or ICP processing chambers can be measured directly or can be calculated or can be used to calculate values of other parameters that provide an indication of the condition of the substrate and/or of the plasma within the plasma processing region.

Also, in some embodiments, the CCP and/or ICP processing chamber is equipped with one or more devices that can optically monitor and/or measure one or more optical characteristics of the plasma within the plasma processing region. The optical characteristics of the plasma can provide an indication of material(s) present in the supplied process gas and of material(s) introduced into the plasma processing region by interactions that occur on the substrate. In some embodiments, the optical characteristics of the plasma can be correlated to one or more condition(s) present on the substrate. For example, optical detection of a given material in the plasma processing region can indicate that an etch front on the substrate has reached a particular material where the etching process should stop, thereby providing optical endpoint detection for the etching process.

Embodiments are disclosed herein for measuring/calculating and monitoring a feedback control signal parameter at location near the substrate to determine a condition of the substrate, and to determine how one or more process parameters may be adjusted to obtain a desired condition of the substrate. The feedback control signal parameter can be one or more of an RF power supply related parameter, an electrical parameter not directly related to the RF power supply, and an optical parameter observed within the plasma processing region. The measured/calculated and monitored feedback control signal(s) can be analyzed in various ways to determine the condition of the substrate. Based on the results obtained from analyzing the measured/calculated and monitored feedback control signal(s), an adjustment can be determined for either the current plasma processing operation or for a subsequent plasma processing operation to achieve, or move toward, a desired condition of the substrate. The adjustment for either the current plasma processing operation or for the subsequent plasma processing operation can be an adjustment to essentially any of one or more controllable plasma process input parameter(s) that has an effect on the condition of the substrate. For example, in various embodiments, the adjusted plasma process input parameter(s) can be a parameter associated with supply of RF power for generation of the plasma, and/or a parameter associated with supply of process gas(es) to the plasma processing region, and/or a parameter associated with supply of bias voltage at the substrate location, and/or a parameter associated with a physical condition within the plasma processing region, such as pressure and/or temperature, and/or a parameter that controls a duration of a given plasma process step, and/or another parameter that, when adjusted, affects the condition of the substrate in a predictable manner.

FIG. 1A shows an example vertical cross-section diagram of a CCP processing chamber 101, in accordance with some embodiments of the present disclosure. The CCP processing chamber 101 includes a plasma processing region 102 within which a plasma 123 is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, the substrate 105 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) semiconductor wafer, a 300 mm semiconductor wafer, or a 450 mm semiconductor wafer. Also, in some embodiments, the substrate 105 referred to herein may correspond to a non-circular substrate, such as a rectangular substrate for a flat panel display, or the like, among other shapes.

The CCP processing chamber 101 is connected to a process gas supply system 104, such that one or more process gas(es) can be supplied in a controlled manner to the plasma processing region 102. It should be understood that the process gas supply system 104 includes one or more process gas sources and an arrangement of valves and mass flow controllers to enable provision of the one or more process gas(es) to the plasma processing region 102 with a controlled flow rate and with a controlled flow time. In various embodiments, the CCP processing chamber 101 operates by having the process gas supply system 104 deliver one or more process gases into the plasma processing region 102, and by applying RF power to the one or more process gases to transform the one or more process gases into the plasma 123 in exposure to the substrate 105, in order to cause a change in material or surface condition on the substrate 105.

The CCP processing chamber 101 includes a substrate support structure 103 upon which the substrate 105 is positioned and supported during processing operations. In some embodiments, an electrode 107 is disposed within the substrate support structure 103 to provide for transmission of RF power from the electrode 107 through the plasma processing region 102 to generate the plasma 123 and/or control ion energy. The electrode 107 is connected to receive RF power through an RF feed structure 109, which is connected to one or more RF power generator(s) 111 by way of one or more impedance matching system(s) 113. The impedance matching system(s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the plasma processing region 102 in an efficient manner, e.g., without unacceptable or undesirable reflection.

Also, in some embodiments, the CCP processing chamber 101 can include an upper electrode 115. In various embodiments, the upper electrode 115 can provide either an electrical ground electrode or can be used to transmit RF power into the plasma processing region 102. For example, in some embodiments, the upper electrode 115 is connected to a reference ground potential, such that the upper electrode 115 provides a return path for RF signals transmitted into the plasma processing region 102 from the electrode 107. Alternatively, in some embodiments, the upper electrode 115 is connected to receive RF power through an RF feed structure 117, which is connected to one or more RF power generator(s) 121 by way of one or more impedance matching system(s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the plasma processing region 102 in an efficient manner, e.g., without unacceptable or undesirable reflection.

In some embodiments, a heater assembly 125 is disposed within the substrate support structure 103 to provide temperature control of the substrate 105. The heater assembly 125 is electrically connected to receive electrical power through an electrical connection 127, where the electrical power is supplied from a power supply 131 through an electrical connection 137 to an RF filter 129, and through the RF filter 129 to the electrical connection 127. In some embodiments, the power supply 131 is an alternating current (AC) power supply. In some embodiments, the power supply 131 is a direct current (DC) power supply. In some embodiments, the heater assembly 125 includes a plurality of electrical resistance heating elements. The RF filter 129 is configured to prevent RF power from entering the power supply 131, while allowing transmission of electrical current between the power supply 131 and the electrical connection 127.

Also, in some embodiments, a bias voltage control system 165 is connected to the substrate support structure 103 within the CCP processing chamber 101. In some embodiments, the bias voltage control system 165 is connected to one or more bias voltage electrodes disposed within the substrate support structure 103 to control a bias voltage present at the location of the substrate 105. The bias voltage can be controlled to attract charged constituents of the plasma 123 toward the substrate 105 and thereby control energy and directionality of the charged constituents of the plasma 123. For example, the bias voltage control system 165 can be operated to accelerate ions in the plasma 123 toward the substrate 105 to perform an anisotropic etch on the substrate 105.

Figure 1B:
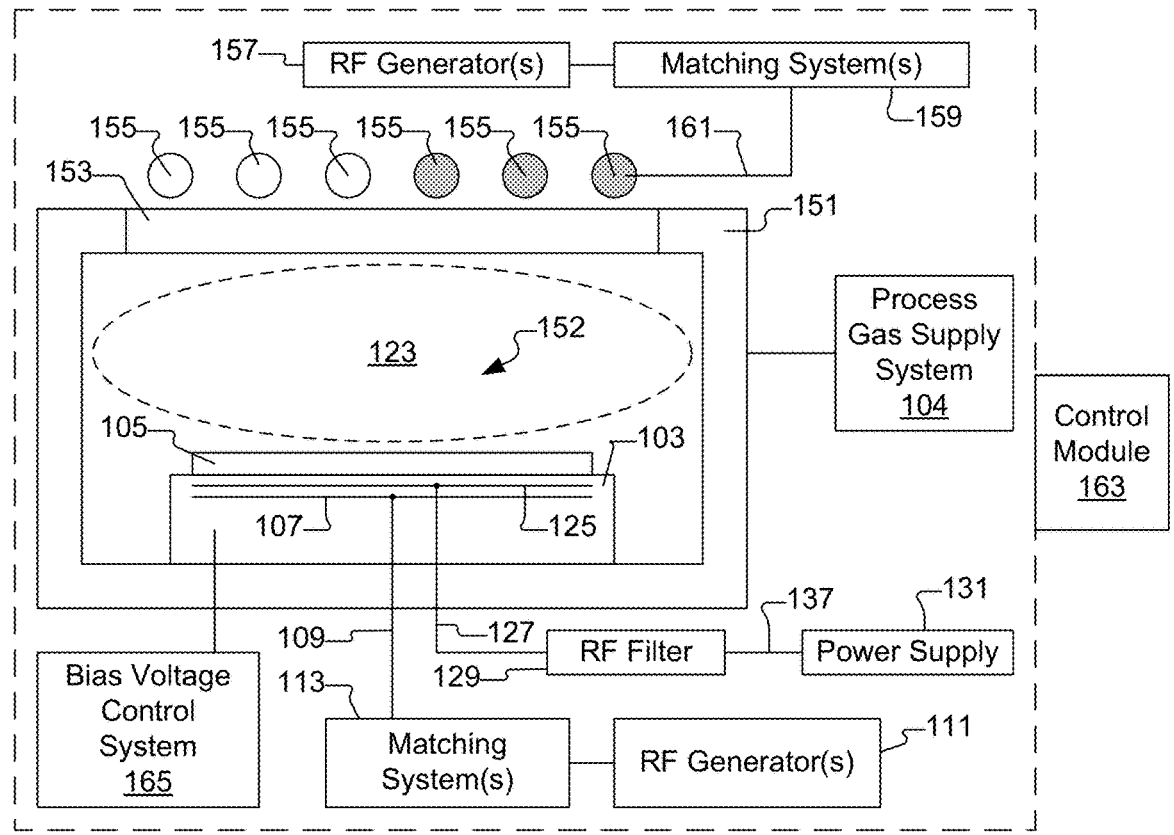
FIG. 1B shows an example vertical cross-section diagram of an ICP processing chamber, in accordance with some embodiments of the present disclosure.

FIG. 1B shows an example vertical cross-section diagram of an ICP processing chamber 151, in accordance with some embodiments of the present disclosure. The ICP processing chamber can also be referred to as a transformer coupled plasma (TCP) processing chamber. For ease of discussion herein, ICP processing chamber will be used to refer to both ICP and TCP processing chambers. The ICP processing chamber 151 includes a plasma processing region 152 in which the plasma 123 is generated in exposure to the substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. It should be understood that the ICP processing chamber 151 can be any type of ICP processing chamber in which RF power is transmitted from a coil 155 disposed outside the ICP processing chamber 151 to a process gas within the ICP processing chamber 151 to generate the plasma 123 within the plasma processing region 152. An upper window structure 153 is provided to allow for transmission of RF power from the coil 155 through the upper window structure 153 and into the plasma processing region 152 of the ICP processing chamber 151.

The ICP processing chamber 151 is connected to the process gas supply system 104, such that one or more process gas(es) can be supplied in a controlled manner to the plasma processing region 152. The ICP processing chamber 151 operates by having the process gas supply system 104 flow one or more process gases into the plasma processing region 152, and by applying RF power from the coil 155 to the one or more process gases to transform the one or more process gases into the plasma 123 in exposure to the substrate 105, in order to cause a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing region 152. In various embodiments, the coil 155 can have any number of turns and any cross-section size and shape (circular, oval, rectangular, trapezoidal, etc.) as appropriate to provide the desired transmission of RF power through the upper window structure 153 into the plasma processing region 152.

The coil 155 is connected through an RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the plasma processing region 152 in an efficient manner, i.e., without unacceptable or undesirable reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the heater assembly 125 disposed within the substrate support structure 103 to provide temperature control of the substrate 105. As described with regard to the CCP processing chamber 101 of FIG. 1A, the heater assembly 125 of the ICP processing chamber 151 is electrically connected to receive electrical power through the electrical connection 127, where the electrical power is supplied from the power supply 131 through the electrical connection 137 to the RF filter 129, and through the RF filter 129 to the electrical connection 127. Also, in some embodiments, the bias voltage control system 165 is connected to the substrate support structure 103 within the ICP processing chamber 151.

A control module 163 is configured and connected to provide for control of plasma process operations performed in the CCP processing chamber 101 and of the ICP processing chamber 151. In some embodiments, the control module 163 is implemented as a combination of computer hardware and software. The control module 163 can be configured and connected to provide for control of essentially any system or component associated with the CCP processing chamber 101 and/or the ICP processing chamber 151. For example, the control module 163 can be configured and connected to control the process gas supply system 104, the RF generator(s) 111, the impedance matching system(s) 113, the RF generator(s) 121, the impedance matching system(s) 119, the power supply 131 for the heater assembly 125, the bias voltage control system 165, the RF generator(s) 157, the impedance matching system(s) 159, and/or any other system or component.

Also, the control module 163 can be connected and configured to receive signals from various components, sensors, and monitoring devices associated with the CCP processing chamber 101 and the ICP processing chamber 151. For example, the control module 163 can be connected and configured to receive electrical measurement signals, e.g., voltage and/or current, and RF measurement signals from one or more of the substrate support structure 103, the RF feed structure 109, the RF feed structure 117, the RF feed structure 161, the electrical connection 127, and from any other structure or component within the CCP processing chamber 101 and the ICP processing chamber 151. And, the control module 163 can be connected and configured to receive temperature and pressure measurement signals from within the plasma processing regions 102 and 152 of the CCP processing chamber 101 and the ICP processing chamber 151, respectively. Also, the control module 163 can be configured and connected to receive, process, and respond to an optically measured signal within the CCP processing chamber 101 and the ICP processing chamber 151.

It should be understood that the control module 163 can be connected and configured to control essentially any active device, i.e., controllable device, associated with operation of the CCP processing chamber 101 and the ICP processing chamber 151. And, it should be understood that the control module 163 can be connected and configured to monitor essentially any physical and/or electrical state, condition, and/or parameter at essentially any location within the CCP processing chamber 101 and the ICP processing chamber 151. The control module 163 can also be configured to direct operation of various components in a synchronous and scheduled manner to perform a prescribed plasma processing operation on the substrate 105. For example, the control module 163 can be configured to operate the CCP processing chamber 101 and the ICP processing chamber 151 by executing process input and control instructions/programs. The process input and control instructions/programs may include process recipes having time-dependent directions for parameters such as power levels, timing parameters, process gases, mechanical movement of the substrate 101, etc., as needed to obtain a desired process result on the substrate 105.

In some embodiments, the plasma processing operation performed in either the example CCP processing chamber 101 of FIG. 1A or the example ICP processing chamber 151 of FIG. 1B is an iterative etch process for logic applications, i.e., for fabrication of structures on the substrate 105 that form portions of logic circuits within semiconductor chips. The iterative etch process includes performance of multiple processing cycles in a consecutive manner for an overall period of time, with each processing cycle including performance of at least one deposition phase and at least one activation phase in a successive and alternating manner, with the at least one deposition phase occurring before the at least one activation phase. In other words, in a given cycle, a deposition phase is performed, then an activation phase is performed, then performance of the deposition phase followed by the activation phase can be repeated for a period of time that defines the length of the given cycle. And, the given cycle can be repeated in a successive manner for an overall period of time or for an overall number of cycles to be performed. In some embodiments, a given cycle can have just one deposition phase followed by just one activation phase. However, in some embodiments, a given cycle can have a plurality of alternating deposition and activation phases, e.g., deposition phase 0, then activation phase 0, then deposition phase 1, then activation phase 1, then deposition phase 2, then activation phase 2, etc. In some embodiments, the duration of a given deposition phase or of a given activation phase is within a range extending from about 0.5 second to about 6 seconds. In some embodiments, duration of a given deposition phase or of a given activation phase is less than about 0.5 seconds. In some embodiments, duration of a given deposition phase or of a given activation phase is greater than about 6 seconds.

In some embodiments, the process can include a periodically performed "super-cycle." In some embodiments, the super-cycle includes one or more activation phases of longer duration. In some embodiments, an activation phase of longer duration in a super-cycle can be achieved by performing multiple activation phases in a successive manner without intervening deposition phases. In some embodiments, a super-cycle can include performance of deposition phases and activation phases in a different manner than in other cycles. In some embodiments, the super-cycle is performed to effectively reset a condition present on the substrate to enable the effectiveness of subsequent cycles to be performed on the substrate 105. In some embodiments, a super-cycle can be performed at a prescribed cycle count, e.g., every tenth cycle. In some embodiments, a super-cycle can be performed based on processing time elapsed. Also, in some embodiments, a decision to perform a super-cycle can be made in real-time based on determination of a condition present on the substrate 105.

In some embodiments, different deposition phases, either in the same cycle or in different cycles, can be defined in either the same manner or in a different manner. Similarly, different activation phases, either in the same cycle or in different cycles, can be defined in either the same manner or in a different manner. The definition of a given deposition phase includes the collective settings of each process parameter that defines and controls the plasma process performed during the given deposition phase. Similarly, the definition of a given activation phase includes the collective settings of each process parameter that defines and controls the plasma process performed during the given activation phase. Examples of process parameters that define and control the plasma process performed in either a deposition phase or an activation phase include RF power, RF frequency, bias RF power, bias RF frequency, DC bias voltage, process gas composition, process gas flow rate, process gas temperature, substrate support structure temperature, chamber pressure, backside He pressure, backside He flowrate, backside He temperature, exhaust flow rate, duration of deposition phase, duration of activation phase, duration of cycle, number of cycles to be performed, among others. Also, each process parameter that defines and controls the plasma process performed in either a deposition phase or an activation phase can be controlled as function of time, and/or cycle, and/or phase. It should be understood that various process parameters that define and control the plasma process performed in the deposition phase and the activation phase can be controlled within a given cycle to achieve desired objectives, so as to move toward a desired condition on the substrate 105.

Because the iterative etch process is not a self-limiting process, the iterative etch process is not a true atomic layer process. However, the iterative etch process can be similar to an atomic layer process by having the deposition phase deposit only a very thin layer of polymer and by having the activation phase correspondingly remove only a small amount material from the substrate 105. In this manner, the iterative etch process provides for low etch damage, e.g., small corner loss in SAC (self-aligned contact) processes, and high selectivity. The high selectivity corresponds to removal/etching of a desired material from the substrate 105, while not removing a significant amount of mask material from the substrate 105, so as to enable formation of clean structure lines and patterns on the substrate 105. Also, the iterative etch process can be defined to optimize etch rate. For example, if the deposition phase deposits just enough polymer on the substrate 105 to react with the oxide material that is to be removed from the substrate 105 in the subsequent activation phase, then the etch rate can be optimized.

In some embodiments, the iterative etch process is defined to etch oxide from the substrate 105 while simultaneously protecting a mask layer present on the substrate 105. In these embodiments, the iterative etch process uses a deposited polymer material to facilitate an active ion etch of oxide from the substrate 105. The iterative etch process is defined to separate the oxide etching mechanism from mask etching, thereby improving etch selectivity. The deposition phase deposits a polymer on the substrate 105 which reacts with material at the surface of the substrate 105. The activation phase selectively removes material at the surface of the substrate 105 that reacted with the polymer deposited in the deposition phase. In some embodiments, the deposition phase deposits a film of polymer in a substantially uniform manner across both the masked areas of the substrate 105 and the areas of the substrate 105 to be etched. The deposited polymer film serves to both protect the masked areas and activate the areas to be etched, where activation of the areas to be etched enables the removal of material in the subsequent activation phase. It should be understood that material is removed, i.e., etched, from the substrate 105 in the activation phase.

Figure 2A:
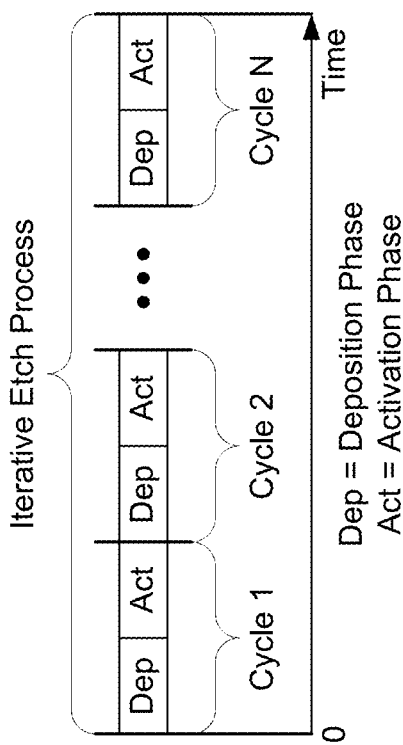
FIG. 2A shows a cycle diagram of an iterative etch process in which each cycle of N total cycles includes one deposition phase and one activation phase, in accordance with some embodiments.

FIG. 2A shows a cycle diagram of an iterative etch process in which each cycle of N total cycles includes one deposition phase and one activation phase, in accordance with some embodiments. In some embodiments, the deposition phase can be defined in the same manner for each cycle, and the activation phase can be defined in the same manner for each cycle. In some embodiments, the deposition phase can be defined in a different manner for some cycles, with the activation phase being defined in the same manner for each cycle. In some embodiments, the deposition phase can be defined in the same manner for each cycle, with the activation phase defined in a different manner for some cycles. In some embodiments, both the deposition phase and the activation phase can be respectively defined in different manners for different cycles.

Figure 2B:
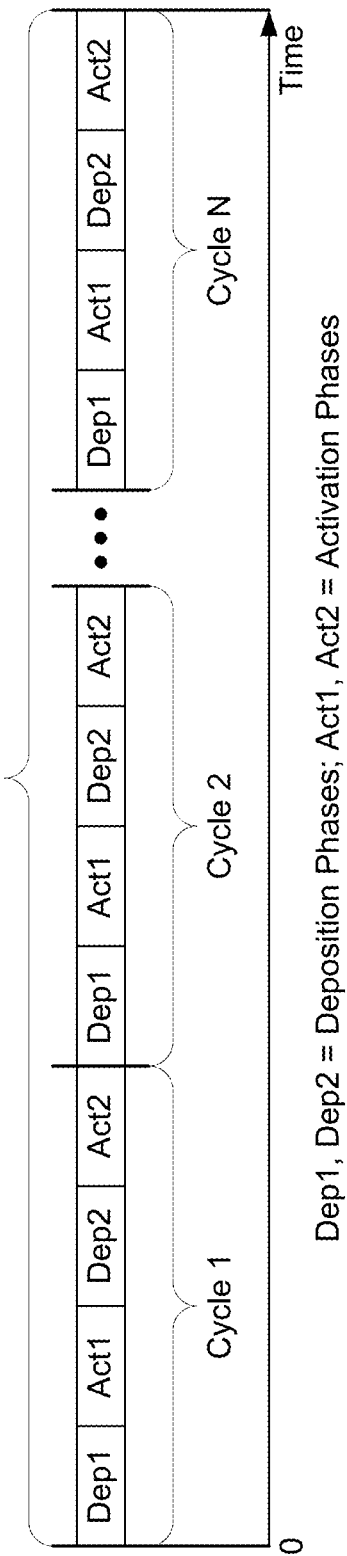
FIG. 2B shows a cycle diagram of an iterative etch process in which each cycle of N total cycles includes multiple deposition phases and multiple activation phases, in accordance with some embodiments.

FIG. 2B shows a cycle diagram of an iterative etch process in which each cycle of N total cycles includes multiple deposition phases and multiple activation phases, in accordance with some embodiments. In various embodiments, the deposition phases within a given cycle can be defined in the same manner or differently. Also, in various embodiments, the activation phases within a given cycle can be defined in the same manner or differently. Also, in various embodiments, the deposition phases within different cycles can be defined in the same manner or differently. Also, in various embodiments, the activation phases within different cycles can be defined in the same manner or differently.

Figure 2C:
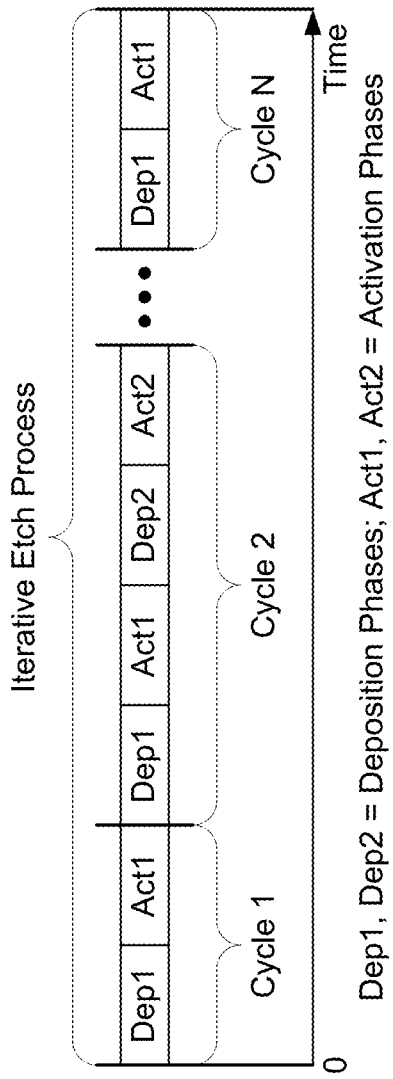
FIG. 2C shows a cycle diagram of an iterative etch process in which different cycles of N total cycles include a different number of deposition phases and/or activation phases, in accordance with some embodiments.

FIG. 2C shows a cycle diagram of an iterative etch process in which different cycles of N total cycles include a different number of deposition phases and/or activation phases, in accordance with some embodiments. For example, FIG. 2C shows a cycle 1 that includes one deposition phase and one activation phase, and shows a cycle 2 that includes two deposition phases and two activation phases. In various embodiments, multiple deposition phases within a given cycle can be defined in the same manner or differently. Also, in various embodiments, multiple activation phases within a given cycle can be defined in the same manner or differently. Also, in various embodiments, the deposition phases within different cycles can be defined in the same manner or differently. Also, in various embodiments, the activation phases within different cycles can be defined in the same manner or differently.

Figure 2D:
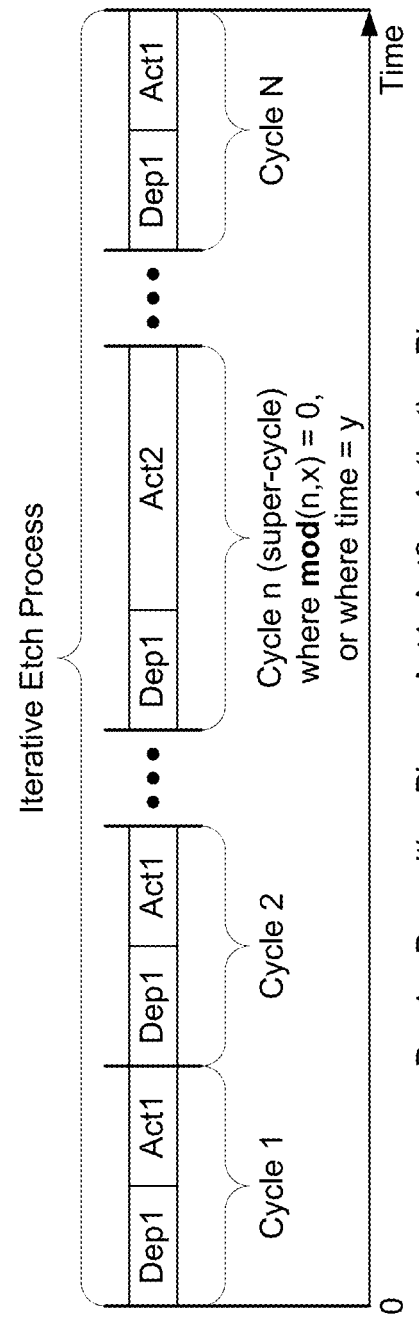
FIG. 2D shows a cycle diagram of an iterative etch process in which a super-cycle is performed periodically over the course of N total cycles, in accordance with some embodiments.

FIG. 2D shows a cycle diagram of an iterative etch process in which a super-cycle is performed periodically over the course of N total cycles, in accordance with some embodiments. In the iterative etch process of FIG. 2D, different cycles of the N total cycles can include either the same number or a different number of deposition phases and either the same number of a different number of activation phases. Also, different deposition phases in either the same cycle or in different cycles can be defined in either the same manner or differently. Also, different activation phases in either the same cycle or in different cycles can be defined in either the same manner or differently. In some embodiments, the super-cycle can be performed at a fixed cycle frequency, e.g., every (x) number of cycles performed as given by mod(n,x)=0, where (n) is the current cycle number. In some embodiments, the super-cycle can be performed as a function of time elapsed during the iterative etch process, e.g., every (y) seconds. In some embodiments, the super-cycle can be performed when a certain condition is observed, such as on the substrate 105, within the plasma 123, and/or within the chamber 101/151. Also, in some embodiments, multiple super-cycles performed over the course of N total cycles can be defined in the same manner. And, in some embodiments, two or more super-cycles performed over the course of N total cycles can be defined in a different manner.

Figure 2E:
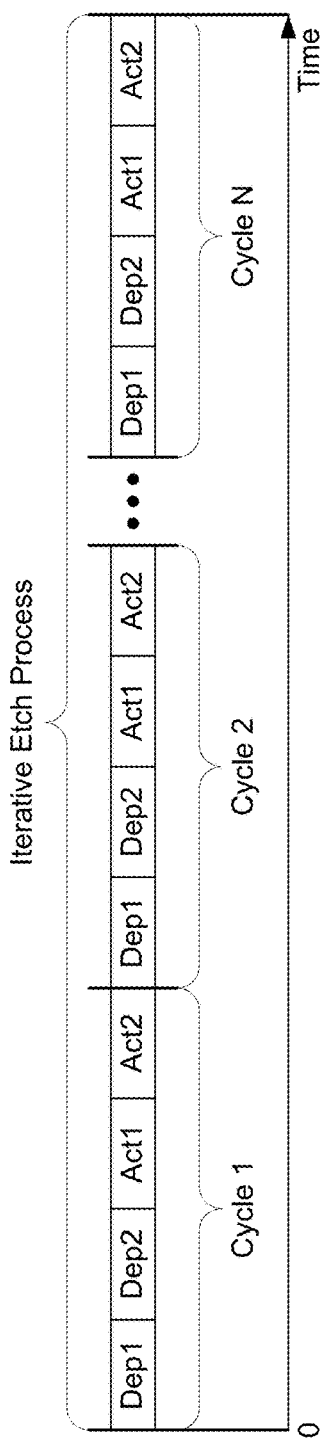
FIG. 2E shows a cycle diagram of an iterative etch process in which each cycle includes multiple successively performed deposition phases and multiple successively performed activation phases, in accordance with some embodiments.

FIG. 2E shows a cycle diagram of an iterative etch process in which each cycle includes multiple successively performed deposition phases and multiple successively performed activation phases, in accordance with some embodiments. In the iterative etch process of FIG. 2E, different cycles of the N total cycles can include either the same number or a different number of deposition phases, and either the same number or a different number of activation phases. Also, different deposition phases in either the same cycle or in different cycles can be defined in either the same manner or differently. Also, different activation phases in either the same cycle or in different cycles can be defined in either the same manner or differently. Also, it should be understood that in the iterative etch process of FIG. 2E different cycle configurations can be used for various cycles throughout the N total cycles. So, in some embodiments, in the iterative etch process of FIG. 2E, some of the N total cycles can be defined to have either one deposition phase or more than two deposition phases, and/or either one activation phase or more than two activation phases.

Figure 2F:
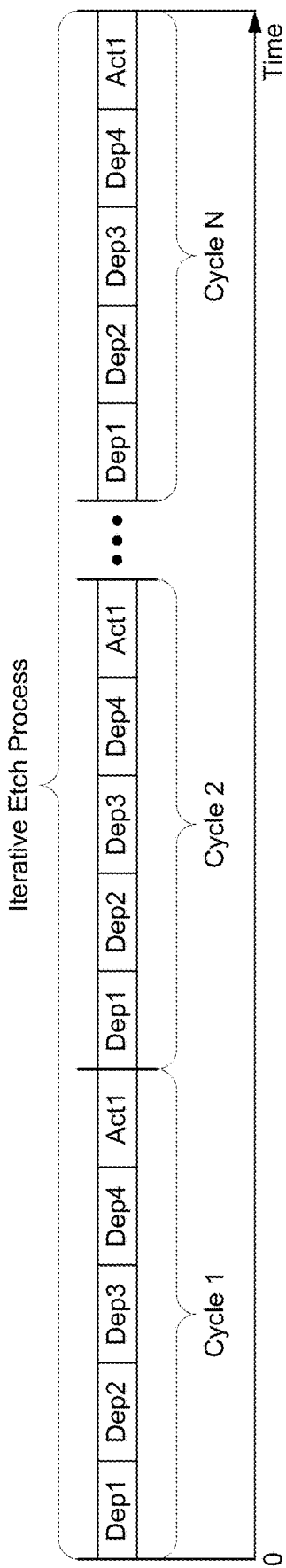
FIG. 2F shows a cycle diagram of an iterative etch process in which each cycle includes multiple successively performed deposition phases followed by an activation phase, in accordance with some embodiments.

FIG. 2F shows a cycle diagram of an iterative etch process in which each cycle includes multiple successively performed deposition phases followed by an activation phase, in accordance with some embodiments. In the iterative etch process of FIG. 2F, different cycles of the N total cycles can include either the same number or a different number of deposition phases, and either the same number or a different number of activation phases, with the number of deposition phases being greater than the number of activation phases. Also, different deposition phases in either the same cycle or in different cycles can be defined in either the same manner or differently. Also, different activation phases in either the same cycle or in different cycles can be defined in either the same manner or differently. Also, it should be understood that in the iterative etch process of FIG. 2F different cycle configurations can be used for various cycles throughout the N total cycles. So, in some embodiments, in the iterative etch process of FIG. 2F, some of the N total cycles can be defined to have either less than four deposition phases or more than four deposition phases, and/or more than one activation phase.

Figure 2G:
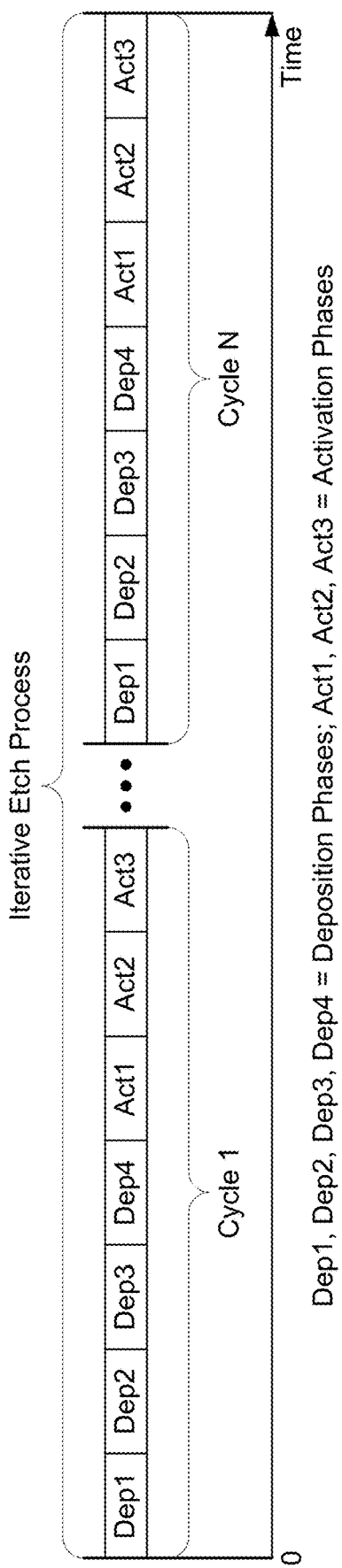
FIG. 2G shows a cycle diagram of an iterative etch process in which each cycle includes multiple successively performed deposition phases followed by multiple successively performed activation phases, in accordance with some embodiments.

FIG. 2G shows a cycle diagram of an iterative etch process in which each cycle includes multiple successively performed deposition phases followed by multiple successively performed activation phases, in accordance with some embodiments. In the iterative etch process of FIG. 2G, different cycles of the N total cycles can include either the same number or a different number of deposition phases, and either the same number or a different number of activation phases, with the number of deposition phases being greater than the number of activation phases. Also, different deposition phases in either the same cycle or in different cycles can be defined in either the same manner or differently. Also, different activation phases in either the same cycle or in different cycles can be defined in either the same manner or differently. Also, it should be understood that in the iterative etch process of FIG. 2G different cycle configurations can be used for various cycles throughout the N total cycles. So, in some embodiments, in the iterative etch process of FIG. 2G, some of the N total cycles can be defined to have either less than four deposition phases or more than four deposition phases, and/or either less than three activation phases or more than three activation phases.

Figure 2H:
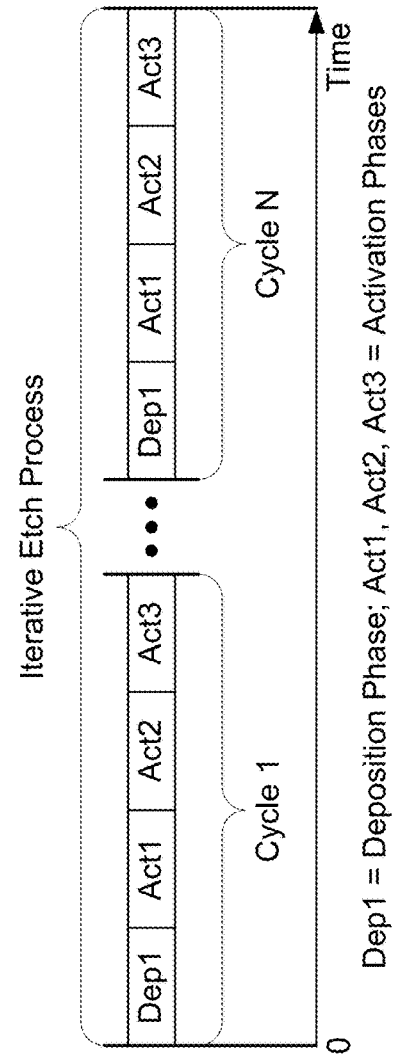
FIG. 2H shows a cycle diagram of an iterative etch process in which each cycle includes a deposition phase followed by multiple successively performed activation phases, in accordance with some embodiments.

FIG. 2H shows a cycle diagram of an iterative etch process in which each cycle includes a deposition phase followed by multiple successively performed activation phases, in accordance with some embodiments. In the iterative etch process of FIG. 2H, different cycles of the N total cycles can include either the same number or a different number of deposition phases, and either the same number or a different number of activation phases, with the number of activation phases being greater than the number of deposition phases. Also, different deposition phases in either the same cycle or in different cycles can be defined in either the same manner or differently. Also, different activation phases in either the same cycle or in different cycles can be defined in either the same manner or differently. Also, it should be understood that in the iterative etch process of FIG. 2H different cycle configurations can be used for various cycles throughout the N total cycles. So, in some embodiments, in the iterative etch process of FIG. 2H, some of the N total cycles can be defined to have more than one deposition phase and/or either less than three activation phases or more than three activation phases.

Figure 2I:
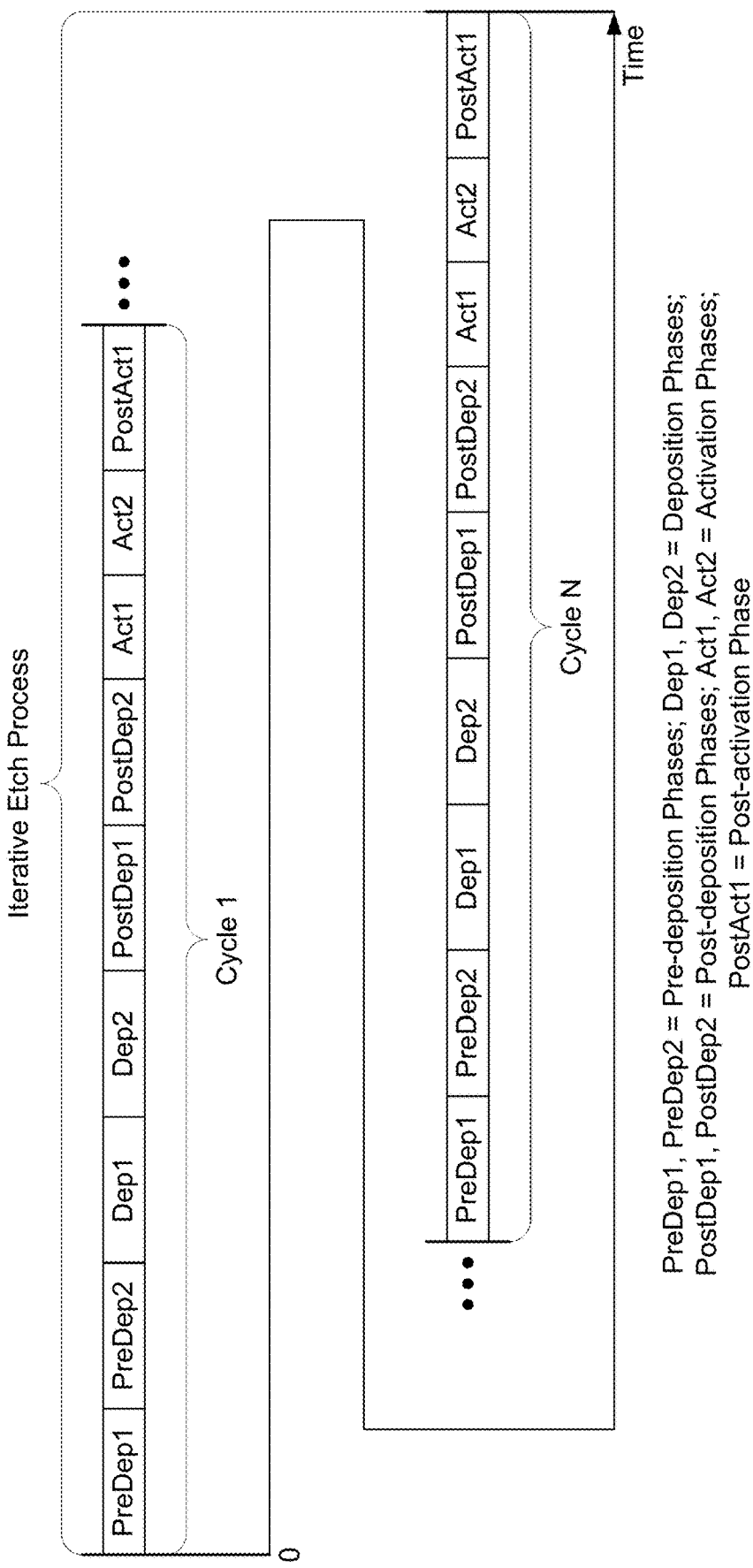
FIG. 2I shows a cycle diagram of an iterative etch process in which each cycle includes multiple successively performed pre-deposition phases, followed by multiple successively performed deposition phases, followed by multiple successively performed post-deposition phases, followed by multiple successively performed activation phases, followed by a post-activation phase, in accordance with some embodiments.

FIG. 2I shows a cycle diagram of an iterative etch process in which each cycle includes multiple successively performed pre-deposition phases, followed by multiple successively performed deposition phases, followed by multiple successively performed post-deposition phases, followed by multiple successively performed activation phases, followed by a post-activation phase, in accordance with some embodiments. In the iterative etch process of FIG. 2I, different cycles of the N total cycles can include either the same number or a different number of pre-deposition phases, and either the same number or a different number of deposition phases, and either the same number or a different number of post-deposition phases, and either the same number or a different number of activation phases, and either the same number or a different number of post-activation phases. Also, different pre-deposition phases in either the same cycle or in different cycles can be defined in either the same manner or differently. Also, different deposition phases in either the same cycle or in different cycles can be defined in either the same manner or differently. Also, different post-deposition phases in either the same cycle or in different cycles can be defined in either the same manner or differently. Also, different activation phases in either the same cycle or in different cycles can be defined in either the same manner or differently. Also, different post-activation phases in either the same cycle or in different cycles can be defined in either the same manner or differently. Also, it should be understood that in the iterative etch process of FIG. 2I different cycle configurations can be used for various cycles throughout the N total cycles. So, in some embodiments, in the iterative etch process of FIG. 2I, some of the N total cycles can be defined to have either less than two or more than two pre-deposition phases, and/or either less than two or more than two deposition phases, and/or either less than two or more than two post-deposition phases, and/or either less than two or more than two activation phases, and/or more than one post-activation phase.

It should be understood that the iterative etch process cycle diagrams of FIGS. 2A through 2I are provided by way of example. In various embodiments, a given iterative etch process can have a cycle diagram that is defined as a variation of any of the cycle diagrams of FIGS. 2A through 2I, with consideration that at least one deposition phase is performed before at least one activation phase in each cycle, and that the iterative etch process includes multiple successively performed cycles. In some embodiments, the definition of each deposition phase and the definition of each activation phase and the total number of cycles to be performed are specified in advance in a recipe for the plasma processing operation. The definition of a given deposition phase is the setting of each process control parameter during the deposition phase and the duration of the deposition phase. Similarly, the definition of a given activation phase is the setting of each process control parameter during the activation phase and the duration of the activation phase. It has been observed that even though the deposition phase(s) and the activation phase(s) are defined in the same manner for different cycles, the process results, e.g., etch results, can vary from one cycle to another cycle within a given plasma process operation, and/or can vary from one plasma processing operation to another plasma processing operation, such as for different substrates 105 undergoing what is supposed to be an equivalent plasma processing operation.

Figure 3:
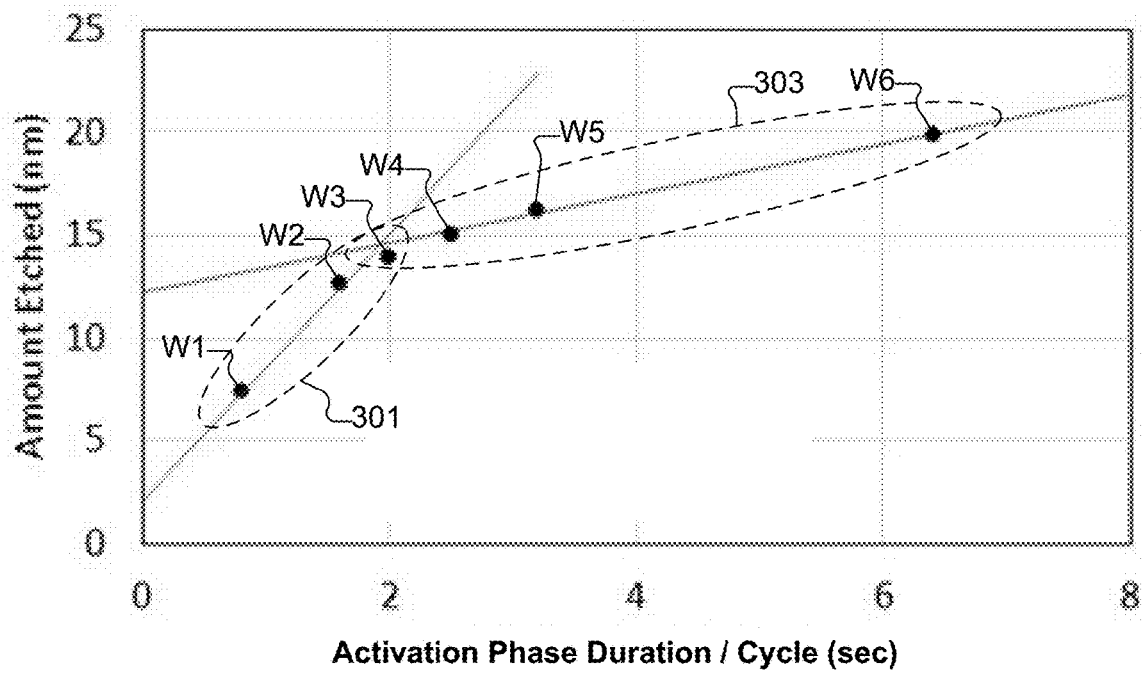
FIG. 3 shows an example activation curve, in accordance with some embodiments.

An example approach for developing an iterative etch process recipe includes measuring an "activation curve" during process development. Then, substrates 105 are etched using a fixed duration for the deposition phase and a fixed duration for the activation phase determined from analysis of the activation curve. FIG. 3 shows an example activation curve, in accordance with some embodiments. To develop the activation curve of FIG. 3, an iterative etch process is performed on six substrates 105. The data points for the six substrates 105 are labeled as W1 through W6 in FIG. 3. The iterative etch process included 40 total cycles, with one deposition phase and one activation phase per cycle. The deposition phase was defined in the same manner for each cycle, with the duration of the deposition phase fixed at 1.5 seconds. The activation phase was defined in the same manner for each cycle with the exception that the duration of the activation phase was varied for each of the six substrates 105 (W1-W6). Specifically, for the first substrate 105 (W1), the activation phase was defined in the same manner for each of the 40 cycles, with the duration of the activation phase fixed at 0.8 second. Then, for the second substrate 105 (W2), the activation phase was defined in the same manner as for the earlier processed substrate 105 (W1) for each of the 40 cycles, with the exception that the duration of the activation phase was fixed at 1.6 seconds. Then, for the third substrate 105 (W3), the activation phase was defined in the same manner as for the earlier processed substrates 105 (W1-W2) for each of the 40 cycles, with the exception that the duration of the activation phase was fixed at 2.0 seconds. Then, for the fourth substrate 105 (W4), the activation phase was defined in the same manner as for the earlier processed substrates 105 (W1-W3) for each of the 40 cycles, with the exception that the duration of the activation phase was fixed at 2.5 seconds. Then, for the fifth substrate 105 (W5), the activation phase was defined in the same manner as for the earlier processed substrates 105 (W1-W4) for each of the 40 cycles, with the exception that the duration of the activation phase was fixed at 3.2 seconds. Then, for the sixth substrate 105 (W6), the activation phase was defined in the same manner as for the earlier processed substrates 105 (W1-W5) for each of the 40 cycles, with the exception that the duration of the activation phase was fixed at 6.4 seconds.

To create the activation curve of FIG. 3, the amount etched (nanometers) by performing the iterative etch process on each of the six substrates 105 (W1-W6) was measured and plotted against the duration of the activation phase used for the corresponding substrate 105. The amount etched is measured as a thickness of material removed from the substrate 105. The resulting activation curve of FIG. 3 shows one section 301 that has a high slope at lower activation phase durations. The activation curve of FIG. 3 also shows another section 303 that has a lower slope at higher activation phase durations. In some embodiments, an optimum duration for the activation phase is taken from the knee in the activation curve where the sections 301 and 303 overlap. For example, based on the example activation curve of FIG. 3, the optimum duration for the activation phase may be taken as about 2 seconds. It is assumed that the low etch rates for low activation phase durations is because the activation, i.e., etch, time is too short. And, it is assumed that the low slope for high activation phase durations is because the activation, i.e., etch, has already removed the reacted polymer and the additional etching is due to unwanted physical sputtering.

Figure 4:
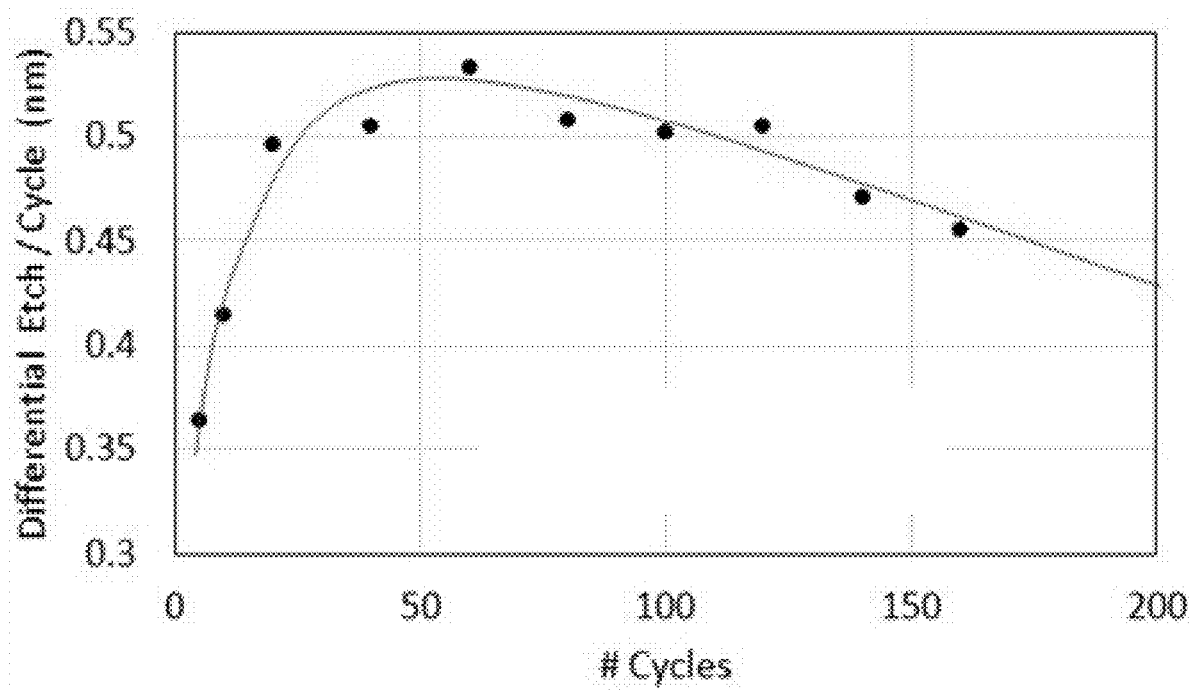
FIG. 4 shows a plot of differential etch rate per cycle versus cycle number in an iterative etch process performed on a substrate, in accordance with some embodiments.

A challenge with the approach described above regarding use of the activation curve, e.g., of FIG. 3, to develop the iterative etch process is that the etching results are not the same for each cycle, even though each cycle is defined in the same manner to include one deposition phase of a fixed duration followed by one activation phase of a fixed/optimum duration. Analysis of the etch rate per cycle when performing the iterative etch process on a given substrate 105 illustrates the inconsistency in etching results from cycle-to-cycle. FIG. 4 shows a plot of differential etch rate per cycle (nanometers) versus cycle number in an iterative etch process performed on a substrate 105. The iterative etch process performed on the substrate 105 to generate the plot of FIG. 4 included successive performance of over 150 cycles, with each cycle including one deposition phase having a fixed duration of 1.5 seconds followed by one activation phase having a fixed duration of 3.2 seconds. As shown in FIG. 4, the etch rate per cycle starts low, then increases to some maximum value as cycles proceed, then decreases again for later cycles.

Figure 5:
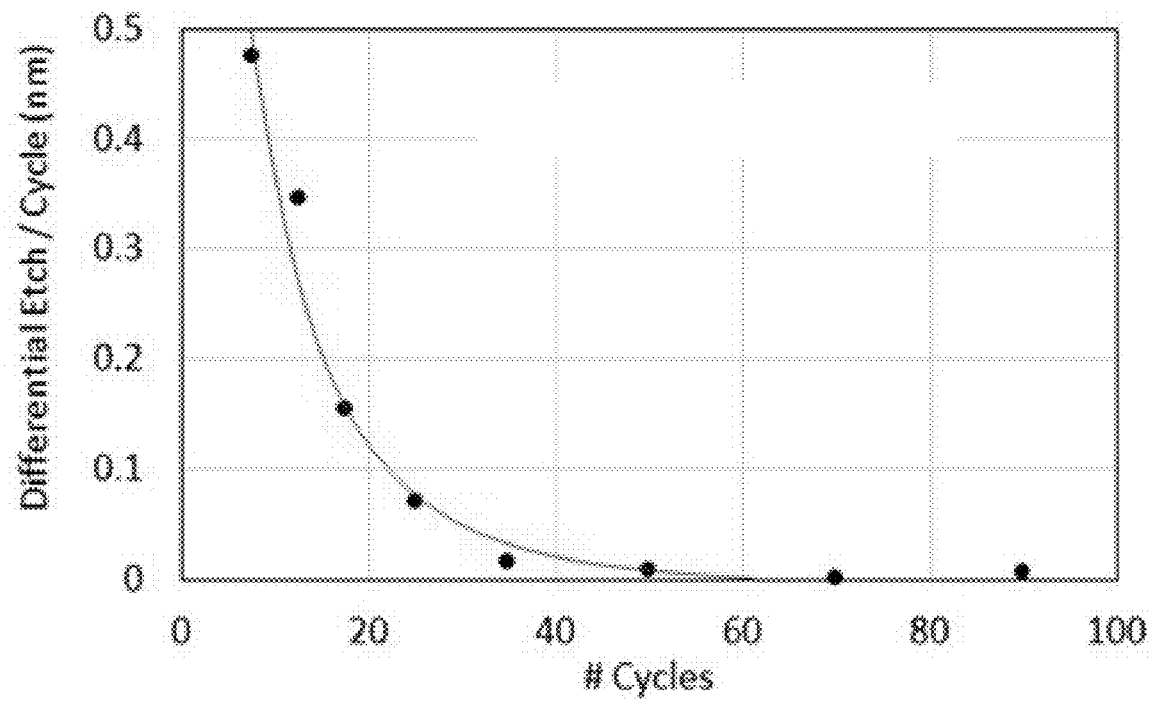
FIG. 5 shows a plot of differential etch rate per cycle versus cycle number in an iterative etch process performed on a substrate, where the etch rate goes to near zero after a number of cycles are performed, in accordance with some embodiments.

Also, depending on how the deposition and activation phases are defined, the etch rate per cycle can actually decrease to zero after some number of cycles are performed. For example, FIG. 5 shows a plot of differential etch rate per cycle (nanometers) versus cycle number in an iterative etch process performed on a substrate 105, where the etch rate goes to near zero after a number of cycles are performed. The iterative etch process performed on the substrate 105 to generate the plot of FIG. 5 included successive performance of over 90 cycles, with each cycle including one deposition phase having a fixed duration of 2.4 seconds followed by one activation phase having a fixed duration of 2.0 seconds. As shown in FIG. 5, the etch rate per cycle starts high, then decreases to near zero as cycles proceed. FIG. 5 represents an example iterative etch process that allows for deposition of too much polymer in the deposition phase and removal of too little material in the activation phase, thereby allowing the deposited polymer material to buildup and choke-off higher aspect ratio regions, e.g., holes and trenches, that are being etched.

As shown in FIGS. 3 through 5, the optimum process parameters for the deposition phase(s) and the activation phase(s) in a given cycle can change over time, i.e., as a function of the number of cycles performed, as conditions on the substrate 105 change and/or as conditions in the processing chamber 101/151 change. Therefore, iterative etch processes that use fixed process parameters for deposition and activation phases over all cycles, such as fixed phase durations, are defined using a compromise of fixed values for the process parameters when the optimum values for the process parameters vary between early cycles and later cycles. The iterative etch processes that use the compromise of fixed values for the process parameters in each cycle will not be optimized for all cycles.

Embodiments are disclosed herein for performing iterative etch processes using a closed-loop feedback control system to vary the process parameters that define the deposition phase(s) and the activation phase(s) on a cycle basis to maintain desired etch results from cycle-to-cycle as the total number of cycles of the iterative etch processes are performed. In various embodiments, desired etch results can be set for etch selectivity and/or etch rate. For example, in some embodiments, the desired etch results are defined as keeping the etch rate approximately constant cycle-to-cycle and avoiding situations where the etch rate drops or the etching stops completely.

The closed-loop feedback control system uses one or more measured and/or calculated feedback control signals to determine an adjustment that should be made to one or more process parameters that define a deposition phase and/or an activation phase in a given cycle in order to maintain desired etch results on the substrate 105. In some embodiments, adjustments to one or more process parameters based on the measured and/or calculated feedback control signals are made on a cycle basis, i.e., from one cycle to another cycle. However, in some embodiments, adjustments to one or more process parameters based on the measured and/or calculated feedback control signals are made within a given cycle, i.e., as the given cycle is being performed. And, in some embodiments, adjustments to one or more process parameters based on the measured and/or calculated feedback control signals are made on an iterative etch process basis, i.e., from one iterative etch process to another iterative etch process, as opposed to during a given iterative etch process.

In various embodiments, one or more feedback control signal(s), either measured or calculated, are correlated to what is actually happening on the substrate 105 in real-time to enable informed decisions about any process parameter adjustment(s) that serve to achieve and/or maintain a desired condition on the substrate 105. In some embodiments, machine learning can be used to facilitate the development process of correlating feedback control signal analysis results, e.g., plot shapes, to particular conditions on the substrate 105. The control module 163 can be configured and connected to acquire the one or more feedback control signal(s), either by measurement and/or calculation, and determine any process parameter adjustment(s) that should be made based on the feedback control signal(s).

In various embodiments, the feedback control signal can be either a measured signal acquired near the substrate 105, or a modeled, i.e., calculated, signal near the substrate 105. In some embodiments, the feedback control signal is an electrical signal that is either directly measured or calculated at a location near the substrate 105, such as within the substrate support structure 103 and/or on the RF feed structure 109, among other locations. In various embodiments, the electrical signal(s) used as the feedback control signal(s) can be an RF parameter and/or a non-RF parameter. The feedback control signal is selected based on its ability to provide an indication about how the substrate 105 surface is responding to the plasma processing operation being performed, as well as how the plasma 123 is changing as the plasma processing operation proceeds, and how chamber 101/151 conditions are changing as the plasma processing operation proceeds. Example feedback control signals that are electrical in nature can include measured and/or calculated values for real impedance, imaginary impedance, impedance magnitude, impedance phase, real gamma (complex reflection coefficient), imaginary gamma, reflected real power, reflected imaginary power, real voltage, imaginary voltage, real current, imaginary current, RF signal frequency, effective delivered power, wafer potential, plasma potential, among others. Also, in some embodiments, the feedback control signal can be an optically measured parameter of the plasma 123. The optically measured parameter can provide an indication of what is coming off of the substrate 105 as etch byproducts, and/or what is going onto the substrate 105 from the delivered process gas. In some embodiments, a single feedback control signal is used in the closed-loop feedback control system for the iterative etch process. In some embodiments, multiple feedback control signals can be simultaneously used in the closed-loop feedback control system for the iterative etch process.

Some of the available "raw" RF signals present on the substrate support structure 103 and/or RF feed structure 109 may not be directly usable as feedback control signals in the closed-loop feedback control system for the iterative etch process because these "raw" RF signals are themselves part of a feedback system for the RF generator(s) 111. For example, in some embodiments, the RF generator(s) 111 can be configured to monitor the RF voltage complex reflection coefficient, but the matching system(s) 113 execute tuning algorithms that work to minimize the RF voltage complex reflection coefficient by varying the tuning capacitor value of the matching system(s) 113, or the RF frequency output by the RF generator(s) 111, or both. In this example, the RF voltage complex reflection coefficient may be a poor indicator of the state of the iterative etch process recipe and/or of the condition of the substrate 105 because the RF voltage complex reflection coefficient depends not only on the state of the iterative etch process recipe, but also on the changing values of the tuning capacitor within the matching system(s) 113 and the output frequency of the RF generator(s) 111. To avoid such issues associated with use of "raw" RF signals as feedback control signals in the closed-loop feedback control system for the iterative etch process, it is possible to use calculated values of RF parameters as generated by an RF matching model as feedback control signals in the closed-loop feedback control system for the iterative etch process. The RF matching model uses the "raw" RF signals as measured on the substrate support structure 103 and/or on the RF feed structure 109 as inputs, and generates values for RF parameters that depend on the state of the iterative etch process and/or condition of the substrate 105 without other dependencies.

The RF parameter values output by the RF matching model are normally used to control the RF signal frequency output by the RF generator(s) 111 and set the substrate support structure 103 bias compensation voltage, e.g., by way of the bias voltage control system 165. Therefore, the RF parameter values output by the RF matching model are readily available for use as feedback control signals in the closed-loop feedback control system for the iterative etch process. In practice, the "raw" RF signals are measured at the substrate support structure 103 and/or at the RF feed structure 109 and are provided as inputs to the RF matching model. Then, the RF matching model computes values for various RF parameters in essentially real-time, such as real impedance, imaginary impedance, impedance magnitude, impedance phase, real gamma, imaginary gamma, reflected real power, reflected imaginary power, real voltage, imaginary voltage, real current, imaginary current, RF signal frequency, and effective delivered power, among others. Then, the values for one or more of the various RF parameters as computed by the RF matching model are used as feedback control signal(s) in the closed-loop feedback control system for the iterative etch process. In various embodiments, the feedback control signal(s) can be measured and/or calculated using hardware and/or software. The measured and/or calculated feedback control signal(s) can be acquired in essentially real-time (e.g., microseconds) so that it is possible to make process adjustments within a given deposition phase inside of a cycle or within a given activation phase inside of a cycle to achieve a desired result.

Examples of the RF matching model referred to herein are provided in U.S. Pat. No. 9,320,126, entitled "Determining a Value of a Variable on an RF Transmission Model," U.S. Pat. No. 9,502,216, entitled "Using Modeling to Determine Wafer Bias Associated With A Plasma System," and U.S. Pat. No. 9,842,725, entitled "Using Modeling to Determine Ion Energy Associated with a Plasma System," each of which is incorporated by reference herein in its entirety for all purposes.

In various embodiments, the one or more feedback control signal(s) used to control the process parameters can be the same for each cycle or can vary for different cycles within a given iterative etch process. Also, in various embodiments, the one or more feedback control signal(s) used to control the process parameters can be the same for each deposition phase in a given cycle or can vary for different deposition phases within a given cycle. And, in various embodiments, the one or more feedback control signal(s) used to control the process parameters can be the same for each activation phase in a given cycle or can vary for different activation phases within a given cycle.

In some embodiments, in a given cycle, the same feedback control signal(s) can be used for both the deposition phase(s) and the activation phase(s). In some embodiments, in a given cycle, the feedback control signal(s) used for the deposition phase(s) are different from the feedback control signal(s) used for the activation phase(s). In some embodiments, the feedback control signal(s) used for the deposition phase(s) can be the same for different cycles. In some embodiments, the feedback control signal(s) used for the deposition phase(s) can be different for different cycles. In some embodiments, the feedback control signal(s) used for the activation phase(s) can be the same for different cycles. In some embodiments, the feedback control signal(s) used for the activation phase(s) can be different for different cycles. In some embodiments, in a given cycle, the feedback control signal(s) used for different deposition phases within the given cycle can change, with the feedback control signal(s) used for activation phase(s) within the given cycle remaining the same. In some embodiments, in a given cycle, the feedback control signal(s) used for different activation phases within the given cycle can change, with the feedback control signal(s) used for deposition phase(s) within the given cycle remaining the same. Also, in some embodiments, in a given cycle, the feedback control signal(s) used for different deposition phases within the given cycle can change, and the feedback control signal(s) used for different activation phases within the given cycle can also change.

The closed-loop feedback control system for the iterative etch process can monitor one or more feedback control signal(s) in essentially real-time to determine whether or not any adjustment(s) need to be made in the processing of the substrate 105, and/or to determine what specific adjustment(s) need to be made in the processing of the substrate 105. In various embodiments, the closed-loop feedback control system for the iterative etch process as implemented through the control module 163 can be configured to provide notifications about feedback control signal analysis results to an operator and/or direct automatic implementation of process changes based on the feedback control signal analysis results.

In some embodiments, an adjustment trigger condition for making a process change based on the feedback control signal analysis can be a percent change in a value of one or more monitored feedback control signal(s) that exceeds a preset percent change threshold value, where the percent change can be either positive, negative, or absolute value. In some embodiments, one or more monitored feedback control signal(s) is/are plotted as a function of time, and the adjustment trigger condition for making a process change based on the feedback control signal analysis can be a detected deviation from a target shape of a plot of a feedback control signal as a function of time. In some embodiments, the deviation from the target shape of the plot of the feedback control signal can be determined by comparing a slope of the plot of the feedback control signal as a function of time over a specified time window and/or cycle window to a threshold slope value, where the threshold slope value can be either positive, negative, or absolute value.

In some embodiments, behavior of one or more feedback control signal(s) over a specified time window and/or cycle window and/or sub-cycle window can be used to determine whether or not a process change is needed to obtain or maintain a desired condition on the substrate 105. And, the behavior of the feedback control signal(s) over the specified time/cycle/sub-cycle window can be evaluated as the iterative etch process proceeds. In some embodiments, the specified time/cycle/sub-cycle window is a moving window that extends up to a current state of the iterative etch process. In some embodiments, the specified time/cycle/sub-cycle window is a moving window that is offset by a specified amount of time, cycle, or sub-cycle from a current state of the iterative etch process.

Figure 6:
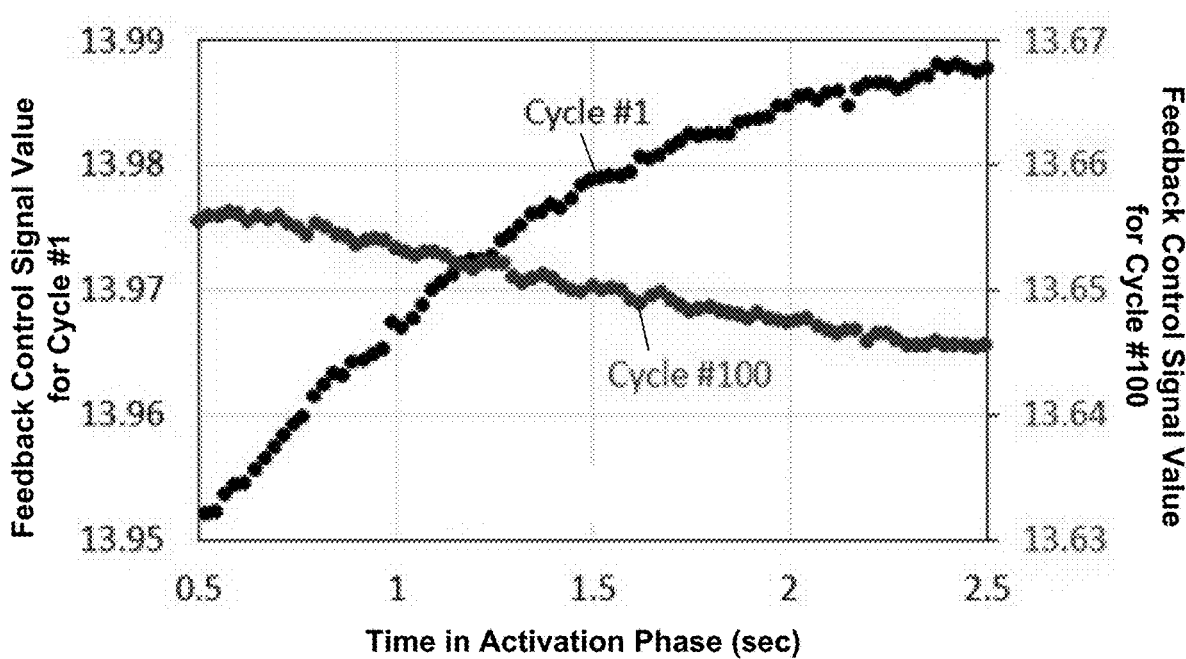
FIG. 6 shows plots of a feedback control signal as monitored during an activation phase performed in a first cycle of an example iterative etch process and during performance of the same activation phase in a hundredth cycle of the example iterative etch process, in accordance with some embodiments.

FIG. 6 shows plots of a feedback control signal as monitored during an activation phase performed in a first cycle (Cycle #1) of an example iterative etch process and during performance of the same activation phase in a hundredth cycle (Cycle #100) of the example iterative etch process, in accordance with some embodiments. In the example iterative etch process corresponding to the plots shown in FIG. 6, each cycle had one deposition phase and one activation phase, and each deposition phase had a duration of 1.5 seconds, and each activation phase had a duration of 2.5 seconds. The plots shown in FIG. 6 correspond to the feedback control signal as monitored just during the activation phases of Cycle #1 and Cycle #100. The plots of FIG. 6 demonstrate an example of how the feedback control signal can change from cycle-to-cycle over the course of the iterative etch process. In various embodiments, the feedback control signal shown in the plots of FIG. 6 may be any of the above-mentioned example feedback control signals that are electrical in nature or may correspond to an optically measured parameter. For example, in some embodiments, the feedback control signal shown in the plots of FIG. 6 can be the calculated imaginary impedance of an RF signal of a given frequency at the RF feed structure 109. Or, for example, in some embodiments, the feedback control signal shown in the plots of FIG. 6 can be the calculated substrate 105 potential. It should be understood that in various embodiments, the feedback control signal used in the closed-loop feedback control system for the iterative etch process can be essentially any electrical parameter, RF parameter, non-RF parameter, and/or optical parameter that is indicative of one or more condition(s) present on the substrate 105 and/or one or more condition(s) present in the plasma 123, and/or one or more condition(s) present within the processing chamber 101/151.

As shown in FIG. 6, during the early cycles, e.g., Cycle #1, the value of the feedback control signal increases as the activation phase of a given cycle is performed. However, during later cycles, e.g., Cycle #100, the value of the feedback control signal decreases as the activation phase of a given cycle is performed. Therefore, over the course of the iterative etch process, the behavior of the feedback control signal during performance of the activation phase of a given cycle changes from exhibiting an increasing trend to exhibiting a decreasing trend. This cycle-dependent change in behavior of the feedback control signal during performance of the activation phase of a given cycle can be caused by changes in a condition of the plasma 123 composition, and/or changes in a condition present on the surface of the substrate 105, and/or changes in a condition present within the processing chamber 101/151, e.g., changes in condition(s) of walls and/or surfaces within the processing chamber 101/151.

Figure 7:
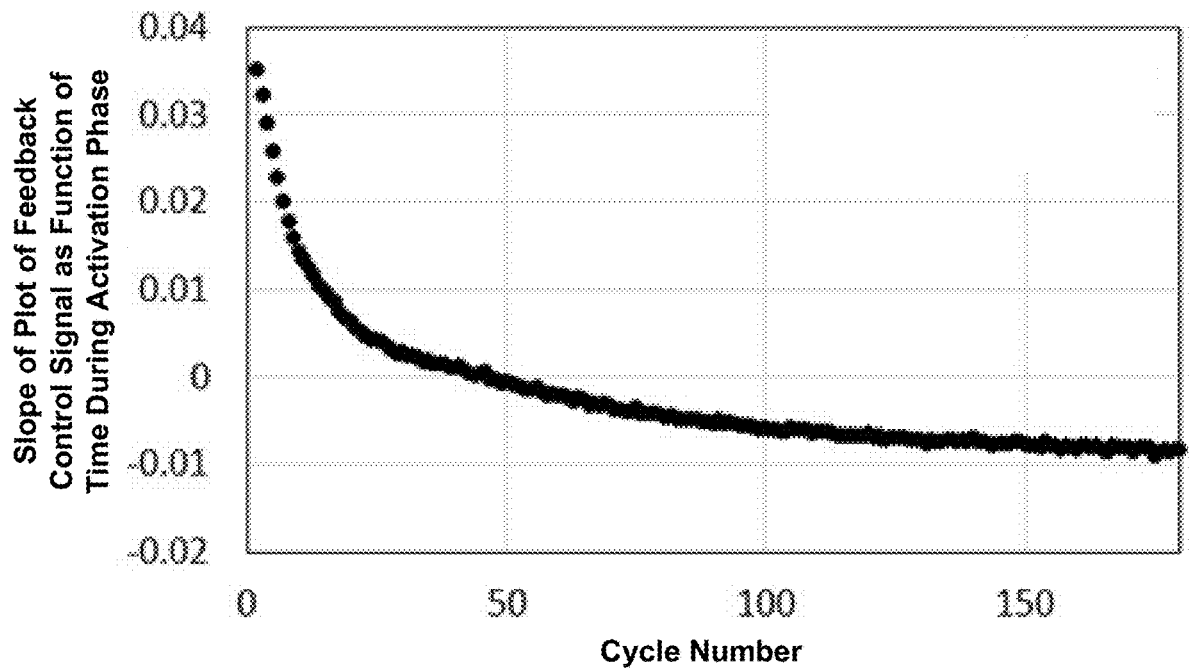
FIG. 7 shows an example plot of how a slope of a plot of a feedback control signal as a function of time during performance of an activation phase varies from cycle-to-cycle through an iterative etch process, in accordance with some embodiments.
Figure 8:
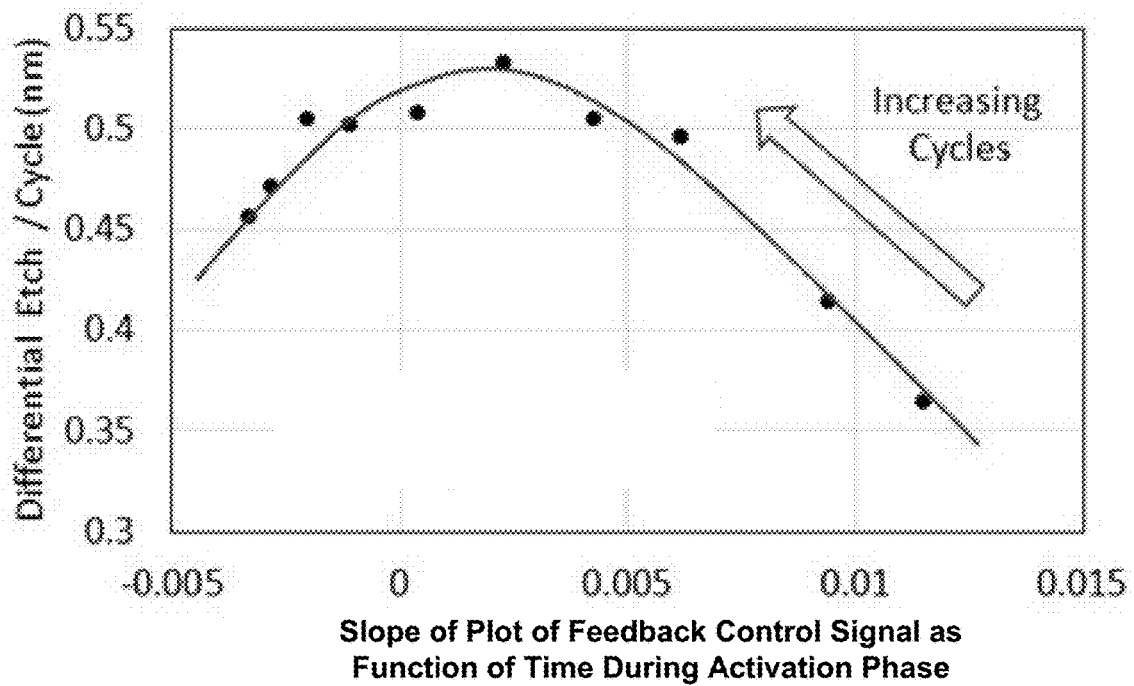
FIG. 8 shows a correlation between a change in etch rate per cycle number and the slope of the plot of the feedback control signal as the function of time during performance of the activation phase, in accordance with some embodiments.

FIG. 7 shows an example plot of how a slope of a plot of a feedback control signal as a function of time during performance of an activation phase varies from cycle-to-cycle through an iterative etch process, where each cycle includes performance of one deposition phase of 1.5 seconds duration and performance of one activation phase of 3.6 seconds duration, in accordance with some embodiments. In the example of FIG. 7, the cycle-dependent slope of the plot of the feedback control signal as the function of time during performance of the activation phase starts positive, then moves toward zero, i.e., flat, near about cycle 45, then gradually moves negative as the iterative etch process continues. Also, in the example of FIG. 7, the slope of the plot of the feedback control signal as the function of time during performance of the activation phase is correlated with the etch rate in each cycle. For example, FIG. 8 shows a correlation between a change in etch rate per cycle number and the slope of the plot of the feedback control signal as the function of time during performance of the activation phase, in accordance with some embodiments. The examples of FIGS. 3 through 8 demonstrate that the feedback control signal used in the closed-loop feedback control system for the iterative etch process can be an indicator of etch rate in some embodiments.

The closed-loop feedback control system for the iterative etch process includes use of the results of the feedback control signal analysis to determine one or more process changes that can be implemented within either the current iterative etch process or within a subsequent iterative etch process to obtain a desired processing result on the substrate 105. The closed-loop feedback control system for the iterative etch process can implement process changes on either a time basis, a cycle basis, and/or a sub-cycle basis. In various embodiments, implementation of process changes on the sub-cycle basis can correspond to changing of one or more process parameter setting(s) from one deposition phase to another deposition phase and/or from one activation phase to another activation phase. And, in various embodiments, implementation of process changes on the sub-cycle basis can correspond to changing of one or more process parameter setting(s) within a given deposition phase and/or within a given activation phase. Therefore, it should be understood that in various embodiments, the closed-loop feedback control system for the iterative etch process includes use of the results of the feedback control signal analysis to determine adjustments to one or more process parameter settings that define a given deposition phase and/or a given activation phase, where the determined adjustments to the one or more process parameter settings can be implemented in either one phase of one cycle, or multiple phases of one cycle, or one phase of multiple cycles, or multiple phases of multiple cycles, where the phase is a deposition phase and/or an activation phase.

In various embodiments, the process parameters available for adjustment in the closed-loop feedback control system for the iterative etch process include RF power, RF frequency, bias RF power, bias RF frequency, DC bias voltage, process gas composition, process gas flow rate, process gas temperature, substrate support structure temperature, chamber pressure, backside He pressure, backside He flowrate, backside He temperature, exhaust flow rate, duration of deposition phase, duration of activation phase, duration of cycle, number of cycles to be performed, and essentially any other controllable process parameter. In some embodiments, adjustments to process parameters based on measured and/or calculated feedback control signal(s) can be made on a microsecond time scale, i.e., sub-millisecond time scale. Because reactions that occur on the substrate 105 generally take place on a time scale of one to one-hundred milliseconds, adjustments to process parameters based on measured and/or calculated feedback control signal(s) as part of the closed-loop feedback control system for the iterative etch process can be made in a timely manner to address a current condition present on the substrate 105 as indicated by the feedback control signal analysis results.

In some embodiments, the closed-loop feedback control system for the iterative etch process can be defined to use the feedback control signal monitoring and analysis results to determine and implement adjustments to one or more process parameters on a cycle-to-cycle basis for the purpose of maintaining an approximately constant etch rate from cycle-to-cycle over the course of the iterative etch process. These embodiments may be particularly useful for iterative etch processes in which the etch rate is low in early cycles, then increases as more cycles are performed, then decreases again during later cycles. For example, in some embodiments, the iterative etch process is defined to perform a fixed number of cycles, with each cycle including performance of one deposition phase followed by performance of one activation phase. In an example embodiment, the closed-loop feedback control system for this iterative etch process can be defined to use the feedback control signal monitoring and analysis results for the deposition phase and/or activation phase of one cycle to determine a duration of the deposition phase and/or a duration of the activation phase for the next cycle as the iterative etch process proceeds.

Figure 9:
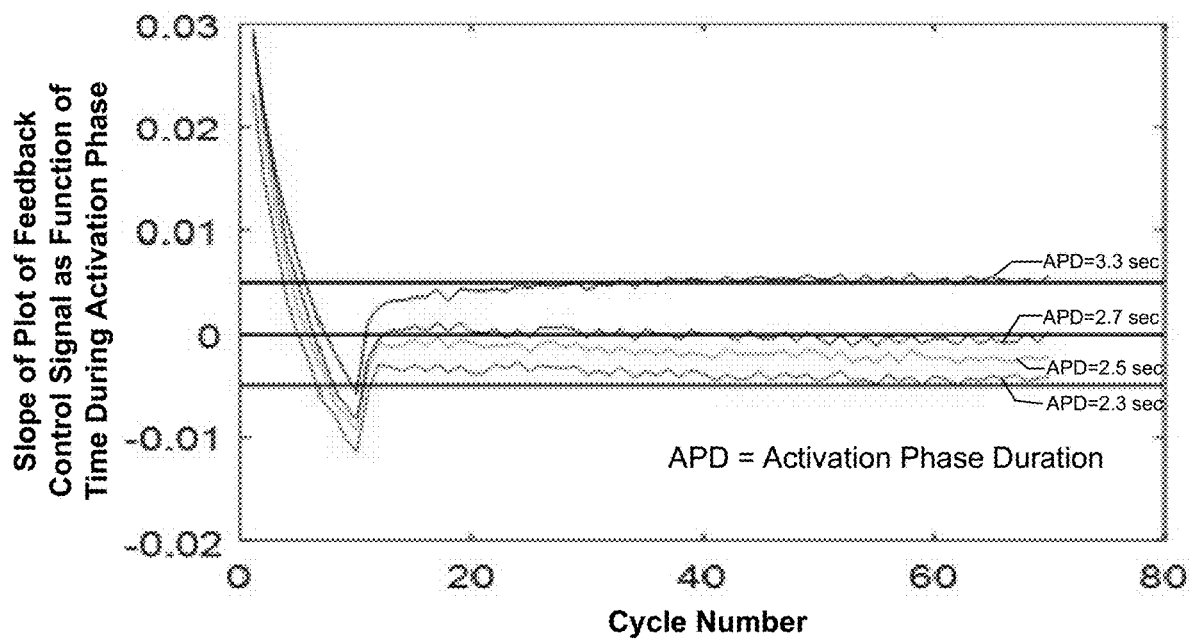
FIG. 9 shows plots of the slope of the plot of the feedback control signal as a function of time during the activation phase versus cycle number for four separate iterative etch processes, in accordance with some embodiments.
Figure 10:
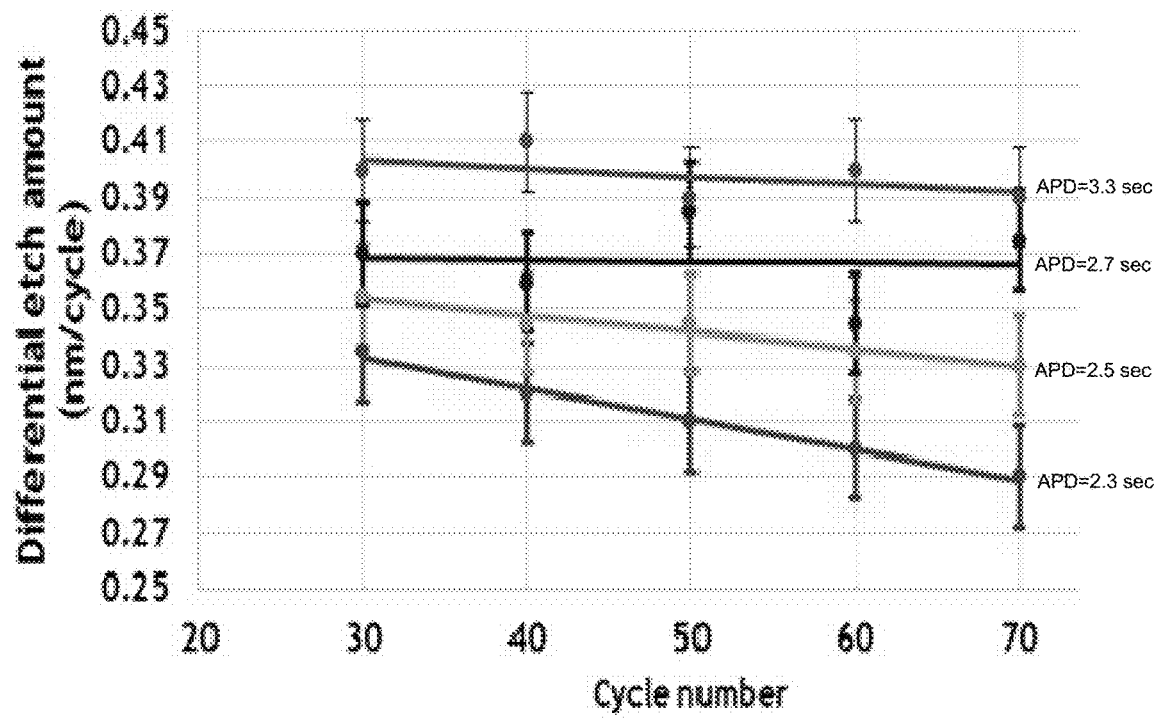
FIG. 10 shows plots of the differential etch rate per cycle as a function of cycle number for the four iterative etch processes of FIG. 9, in accordance with some embodiments.

FIGS. 9 and 10 show plots of data corresponding to implementation of the closed-loop feedback control system for the iterative etch process in which the duration of the deposition phase is adjusted from one cycle to another cycle, in accordance with some embodiments. FIG. 9 shows plots of the slope of the plot of the feedback control signal as a function of time during the activation phase versus cycle number for four separate iterative etch processes. Each of the four iterative etch process included performance of 70 total cycles, with each cycle including one deposition phase and one activation phase. The four iterative etch processes are differentiated from each other by the duration of the activation phase. Specifically, the four iterative etch processes use different activation phase durations of 2.3 seconds, 2.5 seconds, 2.7 seconds, and 3.3 seconds, respectively. In a given iterative etch process, the activation phase duration is the same for each cycle, but the deposition phase duration is adjusted from cycle-to-cycle in order to maintain a substantially constant slope of the plot of the feedback control signal as a function of time during the activation phase. The plots in FIG. 9 demonstrate that it is possible to maintain a substantially constant value for the slope of the plot of the feedback control signal as a function of time during the activation phase from cycle-to-cycle by adjusting the duration of the deposition phase from cycle-to-cycle. The different constant values for the slope of the plot of the feedback control signal as a function of time during the activation phase as shown in FIG. 9 correspond to the use of different activation phase durations in the four separate iterative etch processes.

FIG. 10 shows plots of the differential etch rate per cycle as a function of cycle number for the four iterative etch processes of FIG. 9. The plots of FIG. 10 show that the differential etch rate per cycle behaves in a substantially linear manner as a function of cycle number when the closed-loop feedback control system for the iterative etch process is defined to control the deposition phase duration from cycle-to-cycle. Also, FIG. 10 shows that with a given activation phase duration (2.7 seconds), the differential etch rate per cycle can be maintained at a substantially constant value from cycle-to-cycle when the closed-loop feedback control system for the iterative etch process is defined to control the deposition phase duration from cycle-to-cycle. It should be understood that maintaining the approximately constant etch rate from cycle-to-cycle over the course of the iterative etch process is just one example of many process control objectives that can be realized through use of the closed-loop feedback control system for the iterative etch process as disclosed herein.

In some embodiments, the closed-loop feedback control system for the iterative etch process is defined to determine when it is necessary to run a super-cycle during the course of the iterative etch process. As previously discussed, the iterative etch process can be pre-defined to periodically perform a super-cycle based on cycles performed or time elapsed, in order to restore etch rate after the etch rate has dropped with cycle number. The monitoring and analysis of the feedback control signal(s) can be defined to determine when the surface of the substrate 105 has reached a condition that requires performance of the super-cycle in order to reset conditions on the substrate 105 to enable further effective processing of the substrate 105. In this embodiment, the closed-loop feedback control system for the iterative etch process can direct performance of the super-cycle as needed in lieu of or in combination with the pre-defined schedule for performing the super-cycle.

In some embodiments, the closed-loop feedback control system for the iterative etch process is defined to determine when a given cycle should be stopped. For example, even if a prescribed iterative etch process calls for performance of a given cycle of set duration, the given cycle can be stopped when the monitoring and analysis of the feedback control signal(s) indicate that stopping of the given cycle is advantageous, such as to avoid damage to the substrate 105 and/or to optimize further processing of the substrate 105. Similarly, within a given cycle, the monitoring and analysis of the feedback control signal(s) can be used to determine when a given deposition phase should be stopped, or when a given activation phase should be stopped.

Also, in some embodiments, the monitoring and analysis of the feedback control signal(s) can be used to determine when to make process parameter adjustment(s) for a subsequent deposition phase and/or a subsequent activation phase to be performed within a given cycle. Also, in some embodiments, the monitoring and analysis of the feedback control signal(s) can be used to determine when to make process parameter adjustment(s) within a given deposition phase and/or within a given activation phase. For example, the monitoring and analysis of the feedback control signal(s) can be used to determine when a given deposition phase and/or a given activation phase should be stopped. However, it should be understood that endpoint determination for a given deposition phase and/or activation phase is one of many process parameters that can be adjusted/controlled inside of a given deposition phase and/or activation phase based on the monitoring and analysis of the feedback control signal(s).

The closed-loop feedback control system for the iterative etch process can also be used for substrate-to-substrate process parameter adjustment/control. For example, the monitoring and analysis of the feedback control signal(s) can be used to determine when changing conditions with the process chamber 101/151 may affect processing of subsequent substrates 105. Also, in some embodiments, the closed-loop feedback control system for the iterative etch process can be used to achieve similar process results on substrates 105 in different process chambers 101/151, where conditions of the different process chambers 101/151 vary. Also, the monitoring and analysis of the feedback control signal(s) as part of the closed-loop feedback control system for the iterative etch process can be used to monitor wear of the process chamber 101/151 and/or of a specific component within the process chamber 101/151.

Additionally, the closed-loop feedback control system for the iterative etch process as disclosed herein can be used to facilitate development of iterative etch processes. For example, for an iterative etch process that includes performance of a pre-determined number of cycles, with each cycle including one deposition phase of fixed duration followed by one activation phase of fixed duration, the monitoring and analysis of the feedback control signal(s) as part of the closed-loop feedback control system for the iterative etch process can be used to determine the optimum activation phase duration instead of having to make multiple etch rate measurements on separate substrates 105, which is faster and requires fewer substrates 105, thereby reducing expense. Also, through monitoring and analysis of the feedback control signal(s) as part of the closed-loop feedback control system for the iterative etch process, it is possible to assess the rate at which the feedback control signal(s) change with cycle number, which gives more insight into the iterative etch process, as opposed to only assessing the final etch result that represents a sum of effects over all cycles of the iterative etch process.

It should be understood that the closed-loop feedback control system for the iterative etch process as disclosed herein provides for separate optimization of earlier-performed cycles and later-performed cycles within the iterative etch process. The optimization of various cycles within the iterative etch process can be directed toward etch rate, etch selectivity, loading, etc., by way of example. Additionally, monitoring and analysis of the feedback control signal(s) during the iterative etch process can assist with development of improved iterative etch processes.

Figure 11:
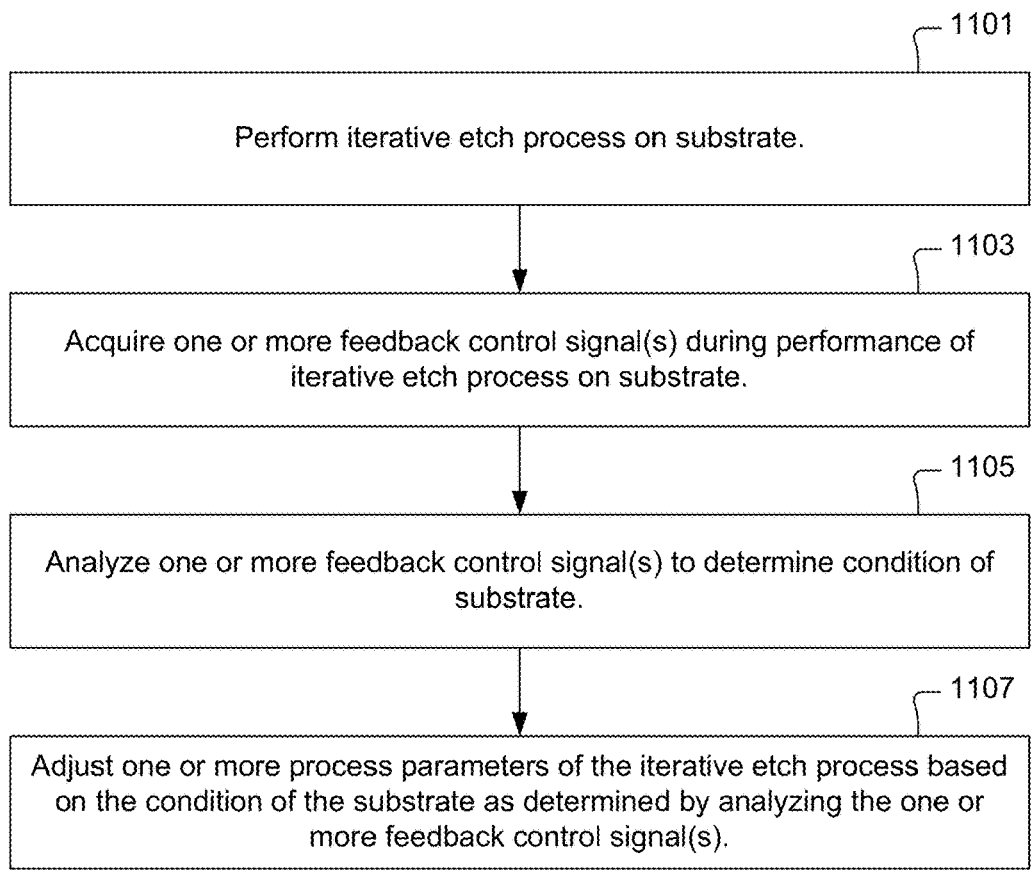
FIG. 11 shows a flowchart of a method for processing a substrate, in accordance with some embodiments.

FIG. 11 shows a flowchart of a method for processing a substrate, in accordance with some embodiments. The method includes an operation 1101 for performing an iterative etch process on a substrate. The iterative etch process includes a plurality of cycles performed in a successive manner. Each cycle of the plurality of cycles includes a deposition phase and an activation phase. The deposition phase is performed before the activation phase in each cycle. The deposition phase is defined as a plasma-based process to enable removal of a particular material from a surface of the substrate. In some embodiments, a plasma is generated in exposure to the substrate during the deposition phase to deposit a polymer material on the surface of the substrate. The polymer material reacts with the particular material to enable removal of just the particular material from the surface of the substrate in the activation phase that follows the deposition phase. The activation phase is defined as a plasma-based process to remove the particular material from the surface of the substrate.

The method also includes an operation 1103 for acquiring one or more feedback control signal(s) during performance of the iterative etch process on the substrate. The one or more feedback control signal(s) is/are correlated to a condition of the substrate. In various embodiments, the one or more feedback control signal(s) is/are one or more of a real impedance, an imaginary impedance, an impedance magnitude, an impedance phase, a real gamma, an imaginary gamma, a reflected real power, a reflected imaginary power, a real voltage, an imaginary voltage, a real current, an imaginary current, an RF signal frequency, an effective delivered power, a wafer potential, and a plasma potential, among others. In some embodiments, the one or more feedback control signal(s) include an optically measured parameter. In some embodiments, the one or more feedback control signal(s) is/are directly measured in operation 1103. In some embodiments, the one or more feedback control signal(s) is/are calculated in operation 1103, such as by using a radiofrequency impedance matching model or by using another algorithm.

The method also includes an operation 1105 for analyzing the one or more feedback control signal(s) to determine the condition of the substrate. And, the method includes an operation 1107 for adjusting one or more process parameters of the iterative etch process based on the condition of the substrate as determined by analyzing the one or more feedback control signal(s) in operation 1105. In some embodiments, the one or more feedback control signal(s) that is/are acquired and analyzed in operations 1103 and 1105, respectively, during the deposition phase of each cycle of the plurality of cycles is/are the same as the one or more feedback control signal(s) that is/are acquired and analyzed in operations 1103 and 1105, respectively, during the activation phase of each cycle of the plurality of cycles. In some embodiments, the one or more feedback control signal(s) that is/are acquired and analyzed in operations 1103 and 1105, respectively, during the deposition phase of each cycle of the plurality of cycles is/are different than the one or more feedback control signal(s) that is/are acquired and analyzed in operations 1103 and 1105, respectively, during the activation phase of each cycle of the plurality of cycles. In some embodiments, the one or more feedback control signal(s) change during performance of the iterative etch process. For example, for a first set of cycles, the one or more feedback control signal(s) may be the imaginary impedance, and for a second set of cycles, the one or more feedback control signal(s) may be an impedance phase.

In some embodiments, analyzing the one or more feedback control signal(s) to determine the condition of the substrate in operation 1105 includes detecting a percent change in the one or more feedback control signal(s) that exceeds a preset percent change threshold value. In some embodiments, analyzing the one or more feedback control signal(s) to determine the condition of the substrate in operation 1105 includes detecting a deviation from a target shape of a plot of the one or more feedback control signal(s) as a function of time. In some embodiments, detecting the deviation from the target shape of the plot of the one or more feedback control signal(s) as the function of time is done by comparing a slope of the plot of the one or more feedback control signal(s) as the function of time over a specified time window to a threshold slope value. In some embodiments, analyzing the one or more feedback control signal(s) to determine the condition of the substrate in operation 1105 includes analyzing behavior of the one or more feedback control signal(s) over a specified time window, where the specified time window moves forward in time as the iterative etch process proceeds.

In various embodiments, the one or more process parameters that are adjusted in operation 1107 can include one or more of RF power, RF frequency, bias RF power, bias RF frequency, direct current (DC) bias voltage, process gas composition, process gas flow rate, process gas temperature, substrate support structure temperature, chamber pressure, backside helium pressure, backside helium flowrate, backside helium temperature, exhaust flow rate, duration of the deposition phase, duration of the activation phase, duration of a given cycle, and a total number of the plurality of cycles, among others. In some embodiments, adjusting one or more process parameters in operation 1107 is done between performance of successive cycles of the plurality of cycles. In some embodiments, adjusting one or more process parameters in operation 1107 corresponds to insertion of a super-cycle in the plurality of cycles, where the super-cycle has a longer duration of the activation phase than other cycles of the plurality of cycles. In some embodiments, adjusting one or more process parameters in operation 1107 is done within a given cycle of the plurality of cycles. In some embodiments, adjusting one or more process parameters in operation 1107 is done between performance of the deposition phase and performance of the activation phase within the given cycle. In some embodiments, adjusting one or more process parameters in operation 1107 is done within the deposition phase within the given cycle. In some embodiments, adjusting one or more process parameters in operation 1107 is done by stopping performance of the deposition phase within the given cycle before a prescribed duration of the deposition phase is completed. In some embodiments, adjusting one or more process parameters in operation 1107 is done within the activation phase within the given cycle. In some embodiments, adjusting one or more process parameters in operation 1107 is done by stopping performance of the activation phase within the given cycle before a prescribed duration of the activation phase is completed.

In some embodiments, adjusting one or more process parameters of the iterative etch process in operation 1107 is performed automatically based on the condition of the substrate as determined by analyzing the one or more feedback control signal(s) in operation 1105. In some embodiments, acquiring the one or more feedback control signal(s) in operation 1103, analyzing the one or more feedback control signal(s) in operation 1105, and adjusting one or more process parameters of the iterative etch process in operation 1107 is collectively performed on a sub-millisecond time scale. In some embodiments, the method includes providing a notification of the condition of the substrate as determined by analyzing the one or more feedback control signal(s) in operation 1105 to an operator. The operator can then direct the adjusting of one or more process parameters of the iterative etch process in operation 1107.

Although the method operations shown in the flowchart of FIG. 11 are present in a sequential order, it should be understood that two or more of the method operations can be performed in a parallel manner, i.e., simultaneous manner. Also, it should be understood that operations 1103, 1105, and 1107 are performed simultaneously with operation 1101. Also, in various embodiments, operations 1103 and/or 1105 and/or 1107 can be performed in either a continuous manner or at prescribed intervals during the iterative etch process. Also, it should be understood that other operations may be performed in between or in conjunction with any of the operations shown in FIG. 11.

In some embodiments, the control module 163 as shown in FIGS. 1A and 1B is (or includes) a control module for controlling processing of a substrate that includes a processor and a memory configured to execute program instructions to direct performance of an iterative etch process on the substrate. The iterative etch process includes a plurality of cycles performed in a successive manner, where each cycle of the plurality of cycles includes a deposition phase and an activation phase, and where the deposition phase is performed before the activation phase in each cycle. The deposition phase is defined as a plasma-based process to enable removal of a particular material from a surface of the substrate. The activation phase is defined as a plasma-based process to remove the particular material from the surface of the substrate. The control module includes data acquisition hardware and software configured to acquire one or more feedback control signal(s) during performance of the iterative etch process on the substrate. The one or more feedback control signal(s) is/are correlated to a condition of the substrate. The control module also includes logic executable by the processor in conjunction with the memory to analyze the one or more feedback control signal(s) to determine the condition of the substrate. And, the control module includes logic executable by the processor in conjunction with the memory to adjust one or more process parameters of the iterative etch process based on the condition of the substrate as determined by analyzing the one or more feedback control signal(s).

Figure 12:
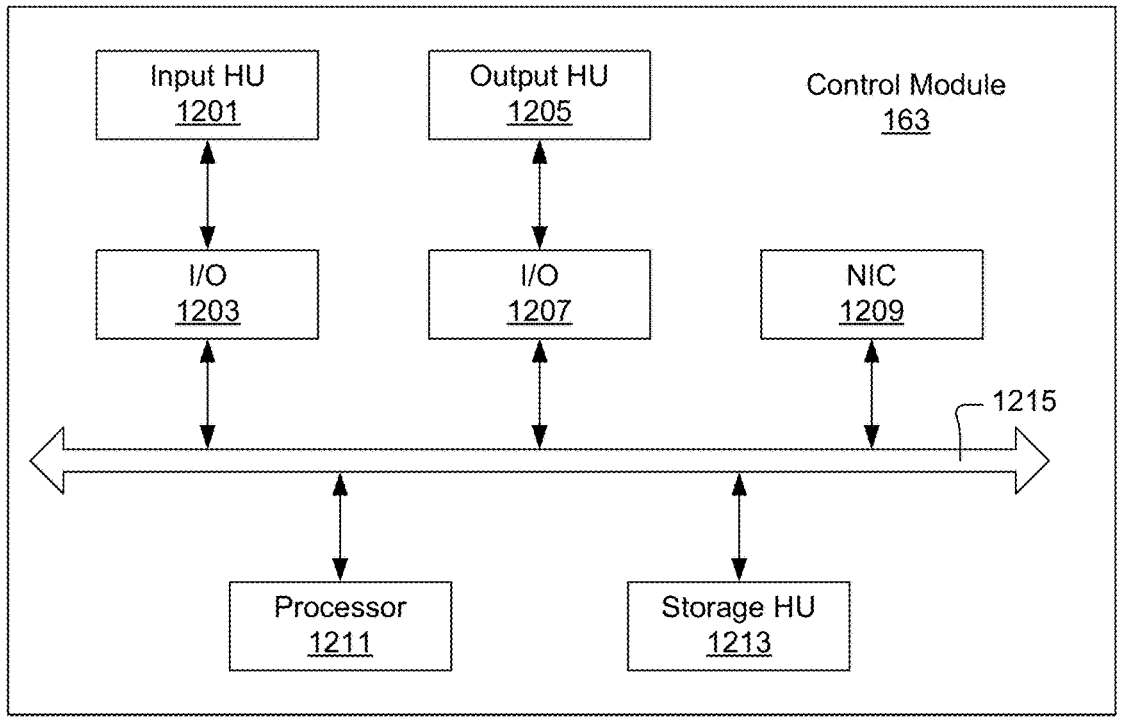
FIG. 12 shows a diagram of a control module, in accordance with some embodiments.

FIG. 12 shows a diagram of a control module 163, in accordance with some embodiments. The control module 163 includes a processor 1211, a storage hardware unit (HU) 1213 (e.g., memory), an input HU 1201, an output HU 1205, an input/output (I/O) interface 1203, an I/O interface 1207, a network interface controller (NIC) 1209, and a data communication bus 1215. The processor 1211, the storage HU 1213, the input HU 1201, the output HU 1205, the I/O interface 1203, the I/O interface 1207, and the NIC 1209 are in data communication with each other by way of the data communication bus 1215. Examples of the input HU 1201 include a mouse, a keyboard, a stylus, a data acquisition system, a data acquisition card, etc. Examples of the output HU 1205 include a display, a speaker, a device controller, etc. Examples of the NIC 1209 include a network interface card, a network adapter, etc. Each of the I/O interfaces 1203 and 1207 is defined to provide compatibility between different hardware units coupled to the I/O interface. For example, the I/O interface 1203 can be defined to convert a signal received from the input HU 1201 into a form, amplitude, and/or speed compatible with the data communication bus 1215. Also, the I/O interface 1207 can be defined to convert a signal received from the data communication bus 1215 into a form, amplitude, and/or speed compatible with the output HU 1205. Although various operations are described herein as being performed by the processor 1211 of the control module 163, it should be understood that in some embodiments various operations can be performed by multiple processors of the control module 163 and/or by multiple processors of multiple computing systems connected to the control module 163.

Embodiments described herein may be practiced with various computer system configurations including hand-held hardware units, microprocessor systems, microprocessor-based or programmable consumer electronics, minicomputers, mainframe computers and the like. Embodiments described herein can also be practiced in distributed computing environments where tasks are performed by remote processing hardware units that are linked through a network. It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for processing a substrate, comprising:
    performing an iterative etch process on a substrate, the iterative etch process including a plurality of cycles performed in a successive manner, each cycle of the plurality of cycles including a deposition phase and an activation phase, the deposition phase defined as a plasma-based process to enable removal of a particular material from a surface of the substrate, the activation phase defined as a plasma-based process to remove the particular material from the surface of the substrate, the deposition phase performed before the activation phase in each cycle;
    acquiring one or more feedback control signals during performance of the iterative etch process on the substrate, the one or more feedback control signals correlated to a condition of the substrate;
    analyzing the one or more feedback control signals to determine the condition of the substrate; and
    adjusting one or more process parameters of the iterative etch process based on the condition of the substrate as determined by analyzing the one or more feedback control signals,
    wherein the adjusting one or more process parameters includes insertion of a super-cycle in the plurality of cycles, the super-cycle having a longer duration of the activation phase than other cycles of the plurality of cycles.

2. The method as recited in claim 1, wherein the one or more feedback control signals include one or more of a real impedance, an imaginary impedance, an impedance magnitude, an impedance phase, a real gamma, an imaginary gamma, a reflected real power, a reflected imaginary power, a real voltage, an imaginary voltage, a real current, an imaginary current, a radiofrequency signal frequency, an effective delivered power, a plasma potential, a plasma impedance, a substrate potential, and an optically measured parameter.

3. The method as recited in claim 1, wherein at least one of the one or more feedback control signals is calculated using a radiofrequency impedance matching model.

4. The method as recited in claim 1, wherein a first one of the one or more feedback control signals acquired and analyzed during the deposition phase of each cycle of the plurality of cycles is different than a second one of the one or more feedback control signals acquired and analyzed during the activation phase of each cycle of the plurality of cycles.

5. The method as recited in claim 1, wherein the one or more feedback control signals change during performance of the iterative etch process.

6. The method as recited in claim 1, wherein the one or more process parameters include one or more of radiofrequency (RF) power, RF frequency, bias RF power, bias RF frequency, direct current (DC) bias voltage, process gas composition, process gas flow rate, process gas temperature, substrate support structure temperature, chamber pressure, backside helium pressure, backside helium flowrate, backside helium temperature, exhaust flow rate, duration of the deposition phase, duration of the activation phase, duration of a given cycle, and a total number of the plurality of cycles.

7. The method as recited in claim 1, wherein the adjusting one or more process parameters of the iterative etch process is performed automatically based on the condition of the substrate as determined by analyzing the one or more feedback control signals.

8. The method as recited in claim 1, wherein a plasma is generated in exposure to the substrate during the deposition phase to deposit a polymer material on the surface of the substrate, the polymer material reacting with the particular material to enable removal of just the particular material from the surface of the substrate in the activation phase that follows the deposition phase.

9. A method for processing a substrate, comprising:
    performing an iterative etch process on a substrate, the iterative etch process including a plurality of cycles performed in a successive manner, each cycle of the plurality of cycles including a deposition phase and an activation phase, the deposition phase defined as a plasma-based process to enable removal of a particular material from a surface of the substrate, the activation phase defined as a plasma-based process to remove the particular material from the surface of the substrate, the deposition phase performed before the activation phase in each cycle;

acquiring one or more feedback control signals during performance of the iterative etch process on the substrate, the one or more feedback control signals correlated to a condition of the substrate;

analyzing the one or more feedback control signals to determine the condition of the substrate; and adjusting one or more process parameters of the iterative etch process based on the condition of the substrate as determined by analyzing the one or more feedback control signals, wherein the adjusting one or more process parameters is done between performance of the deposition phase and performance of the activation phase within the given cycle.

10. The method as recited in claim 9, wherein the one or more feedback control signals include one or more of a real impedance, an imaginary impedance, an impedance magnitude, an impedance phase, a real gamma, an imaginary gamma, a reflected real power, a reflected imaginary power, a real voltage, an imaginary voltage, a real current, an imaginary current, a radiofrequency signal frequency, an effective delivered power, a plasma potential, a plasma impedance, a substrate potential, and an optically measured parameter.

11. The method as recited in claim 9, wherein at least one of the one or more feedback control signals is calculated using a radiofrequency impedance matching model.

12. The method as recited in claim 9, wherein a first one of the one or more feedback control signals acquired and analyzed during the deposition phase of each cycle of the plurality of cycles is different than a second one of the one or more feedback control signals acquired and analyzed during the activation phase of each cycle of the plurality of cycles.

13. The method as recited in claim 9, wherein the one or more feedback control signals change during performance of the iterative etch process.

14. The method as recited in claim 9, wherein the one or more process parameters include one or more of radiofrequency (RF) power, RF frequency, bias RF power, bias RF frequency, direct current (DC) bias voltage, process gas composition, process gas flow rate, process gas temperature, substrate support structure temperature, chamber pressure, backside helium pressure, backside helium flowrate, backside helium temperature, exhaust flow rate, duration of the deposition phase, duration of the activation phase, duration of a given cycle, and a total number of the plurality of cycles.

15. The method as recited in claim 9, wherein the adjusting one or more process parameters of the iterative etch process is performed automatically based on the condition of the substrate as determined by analyzing the one or more feedback control signals.

16. The method as recited in claim 9, wherein the adjusting one or more process parameters is also done between performance of successive cycles of the plurality of cycles.

17. A method for processing a substrate, comprising:
performing an iterative etch process on a substrate, the iterative etch process including a plurality of cycles performed in a successive manner, each cycle of the plurality of cycles including a deposition phase and an activation phase, the deposition phase defined as a plasma-based process to enable removal of a particular material from a surface of the substrate, the activation phase defined as a plasma-based process to remove the particular material from the surface of the substrate, the deposition phase performed before the activation phase in each cycle;

acquiring one or more feedback control signals during performance of the iterative etch process on the substrate, the one or more feedback control signals correlated to a condition of the substrate;

analyzing the one or more feedback control signals to determine the condition of the substrate; and adjusting one or more process parameters of the iterative etch process within a given cycle based on the condition of the substrate as determined by analyzing the one or more feedback control signals, wherein the adjusting one or more process parameters is done by stopping performance of the deposition phase within the given cycle before a prescribed duration of the deposition phase is completed.

18. The method as recited in claim 17, wherein the one or more feedback control signals include one or more of a real impedance, an imaginary impedance, an impedance magnitude, an impedance phase, a real gamma, an imaginary gamma, a reflected real power, a reflected imaginary power, a real voltage, an imaginary voltage, a real current, an imaginary current, a radiofrequency signal frequency, an effective delivered power, a plasma potential, a plasma impedance, a substrate potential, and an optically measured parameter.

19. The method as recited in claim 17, wherein at least one of the one or more feedback control signals is calculated using a radiofrequency impedance matching model.

20. The method as recited in claim 17, wherein a first one of the one or more feedback control signals acquired and analyzed during the deposition phase of each cycle of the plurality of cycles is different than a second one of the one or more feedback control signals acquired and analyzed during the activation phase of each cycle of the plurality of cycles.

21. The method as recited in claim 17, wherein the one or more feedback control signals change during performance of the iterative etch process.

22. The method as recited in claim 17, wherein the one or more process parameters include one or more of radiofrequency (RF) power, RF frequency, bias RF power, bias RF frequency, direct current (DC) bias voltage, process gas composition, process gas flow rate, process gas temperature, substrate support structure temperature, chamber pressure, backside helium pressure, backside helium flowrate, backside helium temperature, exhaust flow rate, duration of the deposition phase, duration of the activation phase, duration of a given cycle, and a total number of the plurality of cycles.

23. The method as recited in claim 17, wherein the adjusting one or more process parameters of the iterative etch process is performed automatically based on the condition of the substrate as determined by analyzing the one or more feedback control signals.

24. A method for processing a substrate, comprising:
performing an iterative etch process on a substrate, the iterative etch process including a plurality of cycles performed in a successive manner, each cycle of the plurality of cycles including a deposition phase and an activation phase, the deposition phase defined as a plasma-based process to enable removal of a particular material from a surface of the substrate, the activation phase defined as a plasma-based process to remove the particular material from the surface of the substrate, the deposition phase performed before the activation phase in each cycle;

acquiring one or more feedback control signals during performance of the iterative etch process on the substrate, the one or more feedback control signals correlated to a condition of the substrate;

analyzing the one or more feedback control signals to determine the condition of the substrate; and adjusting one or more process parameters of the iterative etch process within a given cycle based on the condition of the substrate as determined by analyzing the one or more feedback control signals, wherein the adjusting one or more process parameters is done by stopping performance of the activation phase within the given cycle before a prescribed duration of the activation phase is completed.

25. The method as recited in claim 24, wherein the one or more feedback control signals include one or more of a real impedance, an imaginary impedance, an impedance magnitude, an impedance phase, a real gamma, an imaginary gamma, a reflected real power, a reflected imaginary power, a real voltage, an imaginary voltage, a real current, an imaginary current, a radiofrequency signal frequency, an effective delivered power, a plasma potential, a plasma impedance, a substrate potential, and an optically measured parameter.

26. The method as recited in claim 24, wherein at least one of the one or more feedback control signals is calculated using a radiofrequency impedance matching model.

27. The method as recited in claim 24, wherein a first one of the one or more feedback control signals acquired and analyzed during the deposition phase of each cycle of the plurality of cycles is different than a second one of the one or more feedback control signals acquired and analyzed during the activation phase of each cycle of the plurality of cycles.

28. The method as recited in claim 24, wherein the one or more feedback control signals change during performance of the iterative etch process.

29. The method as recited in claim 24, wherein the one or more process parameters include one or more of radiofrequency (RF) power, RF frequency, bias RF power, bias RF frequency, direct current (DC) bias voltage, process gas composition, process gas flow rate, process gas temperature, substrate support structure temperature, chamber pressure, backside helium pressure, backside helium flowrate, backside helium temperature, exhaust flow rate, duration of the deposition phase, duration of the activation phase, duration of a given cycle, and a total number of the plurality of cycles.

30. The method as recited in claim 24, wherein the adjusting one or more process parameters of the iterative etch process is performed automatically based on the condition of the substrate as determined by analyzing the one or more feedback control signals.

* * * * *